US006537869B1

(12) United States Patent
Furuhata

(10) Patent No.: US 6,537,869 B1
(45) Date of Patent: Mar. 25, 2003

(54) SEMICONDUCTOR DEVICES HAVING A NON-VOLATILE MEMORY TRANSISTOR AND METHODS FOR MANUFACTURING THE SAME

(75) Inventor: Tomoyuki Furuhata, Sabata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/663,258

(22) Filed: Sep. 15, 2000

(30) Foreign Application Priority Data

Sep. 17, 1999 (JP) .......................................... 11-263279

(51) Int. Cl.[7] .......................................... H01L 21/8242
(52) U.S. Cl. ........................ 438/239; 438/238; 438/244
(58) Field of Search ................................ 438/238, 239, 438/244, 250

(56) References Cited

U.S. PATENT DOCUMENTS

| 4,651,406 A | | 3/1987 | Shimizu et al. ................. 29/571 |
| 5,045,488 A | | 9/1991 | Yeh ................................. 437/43 |
| 5,108,941 A | * | 4/1992 | Paterson et al. ................ 437/47 |
| 5,153,143 A | | 10/1992 | Schlais et al. .................. 437/43 |
| 5,242,848 A | | 9/1993 | Yeh ................................. 437/43 |
| 5,278,087 A | | 1/1994 | Jenq ............................... 437/43 |
| 5,309,371 A | | 5/1994 | Shikata et al. ................ 364/491 |
| 5,378,919 A | | 1/1995 | Ochiai ........................... 257/204 |
| 5,379,253 A | | 1/1995 | Bergemont ................... 365/185 |
| 5,557,122 A | * | 9/1996 | Shrivastava et al. ........ 257/309 |
| 5,572,054 A | | 11/1996 | Wang et al. ................... 257/322 |
| 5,604,150 A | | 2/1997 | Mehrad .......................... 437/70 |
| 5,650,344 A | | 7/1997 | Ito et al. ........................ 437/40 |
| 5,652,450 A | | 7/1997 | Hirano .......................... 257/323 |
| 5,654,577 A | | 8/1997 | Nakamura et al. ........... 257/392 |
| 5,674,762 A | | 10/1997 | See et al. ...................... 437/31 |
| 5,677,867 A | * | 10/1997 | Hazani ......................... 365/185 |
| 5,687,118 A | | 11/1997 | Chang .................... 365/185.19 |
| 5,712,178 A | | 1/1998 | Cho et al. ....................... 437/43 |
| 5,748,536 A | | 5/1998 | Kwon et al. .............. 365/185.25 |
| 5,907,172 A | | 5/1999 | Sheu ............................. 257/317 |
| 5,908,311 A | | 6/1999 | Chi et al. ...................... 438/258 |
| 5,914,514 A | | 6/1999 | Dejenfelt et al. ............. 257/322 |
| 5,939,749 A | | 8/1999 | Taketa et al. ................. 257/316 |

(List continued on next page.)

FOREIGN PATENT DOCUMENTS

| JP | 3-219496 | 9/1991 | .......... G11C/16/06 |
| JP | 7-142617 | 6/1995 | ....... H01L/21/8247 |
| JP | 7-147336 | 6/1995 | ....... H01L/21/8247 |
| JP | 9-321156 | 12/1997 | ....... H01L/21/8247 |
| JP | 9-321157 | 12/1997 | ....... H01L/21/8247 |
| JP | 11-074389 | 3/1999 | ....... H01L/21/8247 |
| JP | 2000-188344 | 7/2000 | ....... H01L/21/8247 |

OTHER PUBLICATIONS

U.S. Serial No. 09/599,477 (filed Jun. 23, 2000) and pending claims.
US patent 6,429,073 issued Aug. 6, 2002.

Primary Examiner—Richard Elms
Assistant Examiner—Brad Smith
(74) Attorney, Agent, or Firm—Konrad Raynes Victor & Mann, LLP

(57) ABSTRACT

Embodiments include a semiconductor device and a method for manufacturing the same, which simplify the manufacturing steps and provide split gate type non-volatile memory transistors and other device elements mounted on the same chip. In one method, the step of forming the lower electrode of a capacitor 540 and the step of forming a floating gate 40 of a memory transistor 400 are conducted in different steps. As a result, characteristics of the floating gate 40 and characteristics of the lower electrode 54 can be independently optimized. On the other hand, the step of forming a control gate 36 of the memory transistor 400 and the step of forming an upper electrode 58 of the capacitor 540 are conducted in the same step. As a result, the manufacturing process is simplified.

31 Claims, 22 Drawing Sheets

U.S. PATENT DOCUMENTS

| | | | |
|---|---|---|---|
| 5,969,383 A | 10/1999 | Chang et al. | 257/316 |
| 6,004,847 A | 12/1999 | Clementi et al. | 438/258 |
| 6,015,984 A * | 1/2000 | Leu | 257/298 |
| 6,017,795 A | 1/2000 | Hsieh et al. | 438/262 |
| 6,043,123 A | 3/2000 | Wang et al. | 438/258 |
| 6,090,656 A * | 7/2000 | Randazzo | 438/239 |
| 6,103,573 A | 8/2000 | Harari et al. | 438/257 |
| 6,144,064 A | 11/2000 | Cho et al. | 257/321 |
| 6,157,060 A | 12/2000 | Kerber | 257/316 |
| 6,184,093 B1 | 2/2001 | Sung | 438/275 |
| 6,194,269 B1 | 2/2001 | Sung et al. | 438/258 |
| 6,242,773 B1 | 6/2001 | Thomas | 257/315 |

* cited by examiner

SEMICONDUCTOR DEVICES HAVING A NON-VOLATILE MEMORY TRANSISTOR AND METHODS FOR MANUFACTURING THE SAME

Japanese patent application no. 11-263279, filed Sep. 17, 1999, is hereby incorporated by reference in its entirety.

TECHNICAL FIELD

Embodiments include semiconductor devices including a non-volatile memory transistor with a split gate structure, and methods for manufacturing the same.

BACKGROUND

In recent years, a mixed-mounting of various circuits is utilized in view of various demands such as a shortened chip-interface delay, a lowered cost per circuit board, a lowered cost in design and development of a circuit board and the like. A mixed-mounting technology for mounting memory and logic has become one of the important technologies. However, such a mixed-mounting technology presents problems that result in complex processes and higher costs for manufacturing ICs.

SUMMARY

One embodiment of the present invention relates to a method for manufacturing a semiconductor device including a non-volatile memory transistor having a split gate structure formed in a memory region and a capacitor formed in a capacitor region, the capacitor having a structure in which a capacitor insulation layer is interposed between a first capacitor electrode and a second electrode, the method including the steps of (a) forming the first capacitor electrode in the capacitor region; (b) forming the capacitor insulation layer in the capacitor region; (c) forming a gate insulation layer that becomes a component of the non-volatile memory transistor in the memory region; (d) forming a floating gate that becomes a component of the non-volatile memory transistor in the memory region; (e) forming an intermediate insulation layer that becomes a component of the non-volatile memory transistor in the memory region; (f) forming a control gate that becomes a component of the non-volatile memory transistor in the memory region; and (g) forming the second capacitor electrode in the capacitor region. The step (a) and the step (d) are different steps, and the step (f) and the step (g) are a common step.

Another embodiment relates to a semiconductor device including a non-volatile memory transistor having a split gate structure, the semiconductor device including a capacitor having a structure in which a capacitor insulation layer is placed between a first capacitor electrode and a second capacitor electrode, wherein a floating gate that is a component of the non-volatile memory transistor has a film thickness that is different from that of the first capacitor electrode.

Another embodiment relates to a semiconductor device including a non-volatile memory transistor having a split gate structure, the semiconductor device including a capacitor having a structure in which a capacitor insulation layer is interposed between a first capacitor electrode and a second capacitor electrode, wherein a floating gate that is a component of the non-volatile memory transistor has an impurity concentration that is different from that of the first capacitor electrode.

Another embodiment relates to a semiconductor device including a non-volatile memory transistor having a split gate structure, the semiconductor device including a capacitor having a structure in which a capacitor insulation layer is interposed between a first capacitor electrode and a second capacitor electrode, wherein a floating gate that is a component of the non-volatile memory transistor is formed from a material that is different from that of the first capacitor electrode.

Another embodiment relates to a method for manufacturing a semiconductor device including a non-volatile memory transistor having a split gate structure formed in a memory region and a capacitor formed in a capacitor region, the capacitor including a capacitor insulation region positioned between a first capacitor electrode and a second capacitor electrode, the method including forming the first capacitor electrode in the capacitor region. The capacitor insulation layer is formed in the capacitor region. A gate insulation layer that becomes a component of the non-volatile memory transistor is formed in the memory region. A floating gate that becomes a component of the non-volatile memory transistor is formed in the memory region. An intermediate insulation layer that becomes a component of the non-volatile memory transistor is formed in the memory region. A control gate that becomes a component of the non-volatile memory transistor is formed in the memory region. The second capacitor electrode is formed in the capacitor region. The control gate and the second capacitor electrode are formed from the same material during the same processing step.

BRIEF DESCRIPTION OF THE DRAWINGS

Certain embodiments of the invention are described with reference to the accompanying drawings which, for illustrative purposes, are schematic and not necessarily draw to scale.

DETAILED DESCRIPTION

Figure 1:
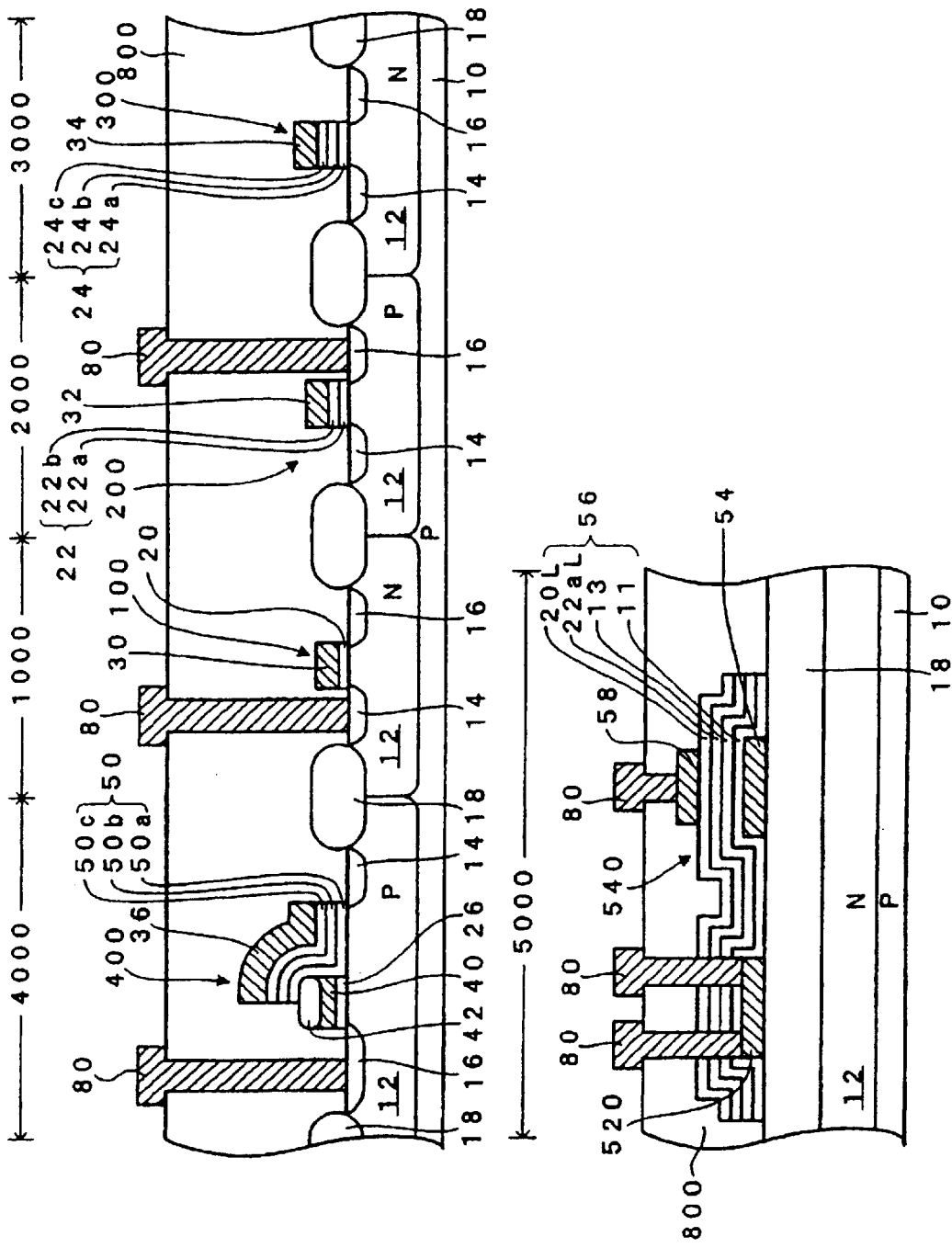
FIG. 1 schematically shows a cross-sectional view of a semiconductor device in accordance with an embodiment of the present invention.

Certain embodiments of the present invention include semiconductor devices and methods for manufacturing the same, which simplify the manufacturing steps and provide split gate type non-volatile memory transistors and other device elements that can achieve the designed performances, when the split gate type non-volatile memory transistors and the other device elements are mounted on the same chip. Embodiments include methods for manufacturing a semiconductor device comprising a non-volatile memory transistor having a split gate structure formed in a memory region and a capacitor formed in a capacitor region, the capacitor having a structure in which a capacitor insulation layer is placed between a first capacitor electrode and a second electrode. Certain preferred methods include the steps of (a) forming the first capacitor electrode in the capacitor region, (b) forming the capacitor insulation layer in the capacitor region, (c) forming a gate insulation layer that becomes a component of the non-volatile memory transistor in the memory region, (d) forming a floating gate that becomes a component of the non-volatile memory transistor in the memory region, (e) forming an intermediate insulation layer that becomes a component of the non-volatile memory transistor in the memory region, (f) forming a control gate that becomes a component of the non-volatile memory transistor in the memory region, and (g) forming the second capacitor electrode in the capacitor region, wherein the step (a) and the step (d) are conducted in different steps, and the step (f) and the step (g) are conducted in a common step.

In accordance with embodiments that include the above-described steps, the manufacturing steps are simplified, and the performance of the split gate type non-volatile memory transistor and the capacitor are substantially isolated from adverse effects.

More particularly, in certain embodiments, the split-gate type non-volatile memory transistor performs a memory operation by injecting charges in a floating gate and drawing charges from the floating gate, in a similar manner as EEPROMs (Electrically Erasable Programmable ROMs). On the other hand, the first capacitor electrode is an electrode in which a voltage is only applied. Therefore, the characteristics required by the floating gate are different from the characteristics required by the first capacitor electrode. As a result, when the floating gate and the first capacitor electrode are formed at the same time, either of them lacks the desired characteristics.

Accordingly, in certain embodiments, the step (a) of forming the first capacitor electrode and the step (d) of forming the floating gate are carried out in different processing steps. As a result, the floating gate and the first capacitor electrode can be provided with the required characteristics, respectively. Accordingly, adverse effects on the performances of the split-gate type non-volatile memory transistor and the capacitor can be substantially avoided.

On the other hand, both of the control gate and the second capacitor electrode are electrodes in which a voltage is applied. Therefore, the characteristics required by the floating gate are not substantially different from the characteristics required by the first capacitor electrode. Accordingly, in certain embodiments, the step (f) of forming the control gate and the step (g) of forming the second capacitor electrode are carried out in the same processing step. As a result, the manufacturing steps are simplified.

In accordance with the description above, at least the following semiconductor devices (1)–(3) can be manufactured:

(1) A semiconductor device comprising a non-volatile memory transistor having a split gate structure, the semiconductor device comprising a capacitor having a structure in which a capacitor insulation layer is placed between a first capacitor electrode and a second capacitor electrode, wherein a floating gate that is a component of the non-volatile memory transistor has a film thickness that is different from that of the first capacitor electrode.

(2) A semiconductor device comprising a non-volatile memory transistor having a split gate structure, the semiconductor device comprising a capacitor having a structure in which a capacitor insulation layer is interposed between a first capacitor electrode and a second capacitor electrode, wherein a floating gate that is a component of the non-volatile memory transistor has an impurity concentration that is different from that of the first capacitor electrode.

(3) A semiconductor device comprising a non-volatile memory transistor having a split gate structure, the semiconductor device comprising a capacitor having a structure in which a capacitor insulation layer is interposed between a first capacitor electrode and a second capacitor electrode, wherein a floating gate that is a component of the non-volatile memory transistor is formed from a material that is different from that of the first capacitor electrode.

In the case of (3) above, when the material of the first capacitor electrode is, for example, polysilicon, the material of the floating gate is, for example, amorphous silicon. In another embodiment, when the material of the first capacitor electrode is, for example, polysilicon, the material of the floating gate may be, for example, polysilicon with crystal grains that are different in size from the crystal grains of the polysilicon of the first capacitor electrode.

In accordance with certain embodiments, the step (b) of forming the capacitor insulation layer and the step (c) of forming the gate insulation layer may preferably be carried out as different steps. The gate insulation layer requires such characteristics as to insulate the floating gate from the semiconductor substrate and to allow charges to pass through the gate insulation layer. On the other hand, the capacitor insulation layer requires a characteristic to store charges.

In accordance with certain embodiments, the step (b) of forming the capacitor insulation layer and the step (c) of forming the gate insulation layer are different steps, such that the capacitor insulation layer and the gate insulation layer can be respectively provided with their required characteristics. Accordingly, adverse effects on the performances of the split-gate type non-volatile memory transistor and the capacitor can be substantially avoided.

The step (b) may in certain embodiments comprise the steps of (b1) forming a first silicon oxide layer that becomes a component of the capacitor insulation layer in the capacitor region, (b2) forming a silicon nitride layer that becomes a component of the capacitor insulation layer in the capacitor region, and (b3) forming a second silicon oxide layer that becomes a component of the capacitor insulation layer in the capacitor region, wherein the step (b1) and the step (c) may preferably be conducted in different steps.

In accordance with certain embodiments, the capacitor insulation layer has a three-layer structure including the first silicon oxide layer, the silicon nitride layer and the second silicon oxide layer. The silicon nitride layer reduces the thickness of the capacitor insulation layer and improves the durability of the capacitor insulation layer.

It is noted that the characteristics required by the first silicon oxide layer that becomes a component of the capacitor insulation layer are generally different from the characteristics required by the gate insulation layer. In accordance with certain embodiments, the step (b1) of forming the first silicon oxide layer and the step (c) of forming the gate insulation layer are carried out as different steps. As a result, the first silicon oxide layer and the gate insulation layer can be provided with their required id characteristics, respectively. Accordingly, adverse effects on the performances of the split-gate type non-volatile memory transistor and the capacitor can be substantially avoided.

Certain embodiments may preferably include, after the step (b2), the step (h) of forming a fourth silicon oxide layer in the capacitor region to cover the silicon nitride layer that becomes a component of the capacitor insulation layer. The first silicon oxide layer and the silicon nitride layer that become components of the capacitor insulation layer are protected by the fourth silicon oxide layer thus formed. In succeeding steps, a memory transistor is formed. The first silicon oxide layer and the silicon nitride layer that become components of the capacitor insulation layer are covered by the fourth silicon oxide layer. As a result, the first silicon oxide layer and the silicon nitride layer that become components of the capacitor insulation layer can be protected from damage that may be caused by steps conducted to form the memory transistor, such as, a thermal oxidation step, a step of forming a silicon nitride layer, an etching step, and the like.

Certain embodiments may preferably include, between the step (h) and the step (c), the step (i) of etching the memory region in a state in which the fourth silicon oxide layer is exposed to thereby expose a semiconductor layer in the memory region, wherein the fourth silicon oxide layer may preferably have a thickness that is not to be removed by the etching step.

After the step (i), a gate insulation layer of the non-volatile memory transistor is formed in the memory region in the step (c). In certain embodiments, the fourth silicon oxide layer may preferably have a thickness that is sufficient for the layer not to be removed by the etching step (i). As a consequence, a mask is not required to cover the fourth silicon oxide layer in the step (i). Thus, the manufacturing steps are simplified.

Certain embodiments may preferably include, between the step (h) and the step (c), the step (j) of etching the memory region, in a state in which the fourth silicon oxide layer is covered by a resist layer, to thereby expose a semiconductor layer in the memory region.

In accordance with certain embodiments, an etching is conducted while the fourth silicon oxide layer is covered by the resist layer. Therefore, an extra amount of the fourth silicon oxide layer that may be etched away by the etching step does not have to be considered. As a result, the thickness of the fourth silicon oxide layer can be reduced.

Certain embodiments may preferably include the step (k) of forming a resistor in a resistor region, wherein the step (a) and the step (k) may be conducted in the same step. By carrying out step (a) of forming the first capacitor electrode and step (k) of forming the resistor during the same operation, the steps are simplified.

Certain embodiments may preferably include the step (l) of forming a resistor in a resistor region, wherein the step (b2) includes the step of forming a silicon nitride layer that becomes a component of the capacitor insulation layer in the register region to cover the resistor, and wherein succeeding steps may be conducted in a state in which the resistor is covered by the silicon nitride layer.

In certain embodiments, the succeeding steps are conducted while the resistor is covered by the silicon nitride layer. As a result, the resistor may be prevented from damage that may be caused by an etching step, an oxidation step and the like.

The step (b3) may preferably include the steps of forming a lower silicon oxide layer and forming an upper silicon oxide layer.

In accordance with certain embodiments, the semiconductor device may preferably comprise a first voltage-type transistor that is formed in a first transistor region and operated at a first voltage level, a second voltage-type transistor that is formed in a second transistor region and operated at a second voltage level, and a third voltage-type transistor that is formed in a third transistor region and operated at a third voltage level.

The first voltage-type transistor may preferably have a gate insulation layer of a one-layer structure, the second voltage-type transistor may preferably have a gate insulation layer of a two-layer structure, and the third voltage-type transistor may preferably have a gate insulation layer of a three-layer structure.

Also, the step of forming the gate insulation layer of the first voltage-type transistor, the step of forming an upper layer of the gate insulation layer of the second voltage-type transistor, the step of forming an upper layer of the gate insulation layer of the third voltage-type transistor, the step of forming an upper layer of the intermediate insulation layer that forms the non-volatile memory transistor, and the step (b3) of forming the upper silicon oxide layer are preferably conducted in the same step. By forming these layers in the same step, the manufacturing steps are simplified.

The step of forming a lower layer of the gate insulation layer of the second voltage-type transistor and the step (b3) of forming the upper silicon oxide layer may preferably be conducted in the same step. By forming these layers in the same step, the manufacturing steps are simplified.

In accordance with certain embodiments, the capacitor may preferably form an analog circuit.

In accordance with certain embodiments, analog circuits and non-volatile memory transistors can be formed on the same semiconductor substrate. When a resistor is formed in a resistor region, the resistor can be formed as a component of an analog circuit.

It is noted that the steps (a) through (l) do not need to be conducted in such an order as described above. The order of the steps may be changed to an extent that the desired effects can be attained.

FIG. 1 schematically shows a cross-sectional view of a semiconductor device including a non-volatile memory transistor in accordance with an embodiment of the present invention. The semiconductor device includes a memory region 4000, a first transistor region 1000, a second transistor region 2000, a third transistor region 3000, and an analog circuit region 5000.

The memory region 4000 includes a non-volatile memory transistor with a split-gate structure (hereinafter referred to as "memory transistor") 400. The first transistor region 1000 includes a first voltage-type transistor 100 that operates at a first voltage level V1 (preferably 1.8–3.3 V in an absolute value). The second transistor region 2000 includes a second voltage-type transistor 200 that operates at a second voltage level V2 (preferably 2.5–5 V in an absolute value). The third transistor region 3000 includes a third voltage-type transistor 300 that operates at a third voltage level V3 (preferably 10–15 V in an absolute value). Embodiments of circuits that use the first through the third voltage-type transistors 100, 200 and 300 will be described below. The analog circuit region 5000 includes a resistor 520, a capacitor 540, and various transistors (not shown). The resistor 520, the capacitor 540, and the variety of transistors form an analog circuit.

The memory transistor 400, the first voltage-type transistor 100, the second voltage-type transistor 200 and the third voltage-type transistor 300 are respectively formed in wells 12 that are formed in a P-type silicon substrate 10. The memory region 4000 and the first through the third transistor regions 1000, 2000 and 3000 are respectively isolated from one another by field insulation layers 18. Also, the transistors in the respective regions 1000 through 4000 are isolated by field insulation layers (not shown) formed in predetermined patterns. In the embodiment shown in the figure, each of the transistors is formed in each of the wells. However, when wells are not required, they may be formed in the substrate. For example, in certain embodiments, N-channel type memory transistors or N-channel type second voltage-type transistors may be formed in the substrate, but not in wells.

The capacitor 540 and the resistor 520 are formed over the field insulation layer 18. The field insulation layer 18 for the analog circuit region 5000 is located over the N-well 12 that is formed over the P-type silicon substrate 10. The well 12 for the analog circuit region 5000 may also be a P-type well.

The first through the third transistor regions 1000, 2000 and 3000 and the memory region 4000 may respectively include N-channel type and P-channel type transistors. However, for the simplicity of description, FIG. 1 shows transistors of either one of the conductivity types.

The memory transistor 400 has a source 16 and a drain 14 composed of $N^+$ type impurity diffusion layers formed in a P-type well 12, and a gate insulation layer 26 formed over the surface of the well 12. A floating gate 40, an intermediate insulation layer 50 and a control gate 36 are successively formed over the gate insulation layer 26.

Further, a selective oxide insulation layer 42 is formed over the floating gate 40. The selective oxide insulation layer 42 is formed by selective oxidation on a part of a polycrystal silicon layer that becomes the floating gate, as described below, and has a structure in which the thickness thereof generally becomes thinner from its center toward its end sections. As a result, upper edge sections of the floating gate 40 generally form sharp edges, such that an electric field concentration is apt to occur at the upper edges of the floating gate 40.

The thickness of the gate insulation layer 26 of the memory transistor 400 may preferably be 6–9 nm, in consideration of the dielectric strength of the memory transistor 400.

The intermediate insulation layer 50 continues from the top surface of the selective oxide insulation film 42 to the side surface of the floating gate 40, further extends along the surface of the silicon substrate 10 and reaches one end of the source 16. The intermediate insulation layer 50 functions as, what is referred to as, a tunnel insulation layer. Further, the intermediate insulation layer 50 is composed of three insulation layers, which are, in the order from the bottom, a silicon oxide layer 50a, a silicon oxide layer 50b and a silicon oxide layer 50c. The silicon oxide layer 50a and the silicon oxide layer 50c are preferably composed of silicon oxide layers that are formed by a thermal oxidation method. The silicon oxide layer 50b is composed of a silicon oxide layer that is preferably formed by a CVD method.

The intermediate insulation layer 50 may preferably have a film thickness of 16–45 nm, in consideration of its function as a tunnel insulation layer. The silicon oxide layer 50a may preferably have a film thickness of 5–15 nm, the silicon oxide layer 50b may preferably have a film thickness of 10–20 nm, and the silicon oxide layer 50c may preferably have a film thickness of 1–10 nm.

The intermediate insulation layer 50 that functions as a tunnel insulation layer preferably has a three-layer structure, and the silicon oxide layer (a first outermost layer) 50a and the silicon oxide layer (a second outermost layer) 50c that respectively contact the floating gate 40 and the control gate 36 are preferably formed from thermal oxidation films. As a result, the interface state between the floating gate 40 and the silicon oxide layer 50a stabilizes, and the interface state between the control gate 36 and the silicon oxide layer 50c stabilizes. As a consequence, the transfer of the charge by the FN conduction from the floating gate 40 through the intermediate insulation layer 50 to the control gate 36 becomes stable, and thus the operation of the memory transistor 400 stabilizes. This contributes to an increase in the number of data writing/erasing operations (cycle life) of the memory transistor 400.

Also, because the intermediate insulation layer 50 preferably has the silicon oxide layer 50b that is composed of a silicon oxide layer which is formed by a CVD method, the dielectric strength between the floating gate 40 and the control gate 36 increases. Also, malfunctions that may occur at the time of writing in or reading from memory cells, namely, write disturbs and read disturbs, can be inhibited.

The first voltage-type transistor 100, when it is a P-channel type MOS transistor, for example, has a source 16 and a drain 14 that are composed of P⁺ type impurity diffusion layers which are formed in the N-type well 12, a gate insulation layer 20 and a gate electrode 30. The first voltage-type transistor 100 is driven at a first voltage level V1 (preferably 1.8–3.3 V in an absolute value). The gate insulation layer 20 may preferably have a film thickness of 3–13 nm, in consideration of the dielectric strength of the first voltage-type transistor 100.

The second voltage-type transistor 200, when it is an N-channel type MOS transistor, for example, has a source 16 and a drain 14 that are composed of N⁺ type impurity diffusion layers which are formed in the P-type well 12, a gate insulation layer 22 and a gate electrode 32. The gate insulation layer 22 is composed of two silicon oxide layers 22a and 22b. The silicon oxide layer 22b is preferably formed in the same step in which the gate insulation layer 20 of the above-described first voltage-type transistor 100 is formed.

The second voltage-type transistor 200 is driven at a second voltage level (preferably 2.5–5 V in an absolute value). The gate insulation layer 22 may preferably have a film thickness of 4–15 nm, in consideration of the dielectric strength of the second voltage-type transistor 200. Also, the thickness of the silicon oxide layer 22a may preferably be 3–15 nm, and the thickness of the silicon oxide layer 22b may preferably be 1–10 nm. The third voltage-type transistor 300, when it is a P-channel type MOS transistor, for example, has a source 16 and a drain 14 that are composed of P⁺ type impurity diffusion layers which are formed in the N-type well 12, a gate insulation layer 24 and a gate electrode 34. The gate insulation layer 24 is formed from three silicon oxide layers, which are, in the order from the bottom, a silicon oxide layer 24a, a silicon oxide layer 24b and a silicon oxide layer 24c. The silicon oxide layers 24a, 24b and 24c may preferably be formed in the same steps in which the silicon oxide layer 50a, the silicon oxide layer 50b and the silicon oxide layer 50c that form the intermediate insulation layer 50 of the memory transistor 400 are formed, respectively.

The third voltage-type transistor 300 is driven at a third voltage level V3 (preferably 10–15 V in an absolute value). The gate insulation layer 24 may preferably have a film thickness of 16–45 nm, in consideration of the dielectric strength of the third voltage-type transistor 300. The silicon oxide layer 24a may preferably have a film thickness of 5–15 nm, the silicon oxide layer 24b may preferably have a film thickness of 10–20 nm, and the silicon oxide layer 24c may preferably have a film thickness of 1–10nm.

The capacitor 540 is equipped with a lower electrode 54 formed over the field insulation layer 18, a capacitor insulation layer 56 formed over the lower electrode 54, and an upper electrode 58 formed over the capacitor insulation layer 56. The capacitor insulation layer 56 preferably has an ONO film, in other words, a layered structure including a silicon oxide layer 11, a silicon nitride layer 13, and silicon oxide layers 22aL and 20L. In order to increase the capacitance of the capacitor 540, the thickness of the capacitor insulation layer 56 needs to be reduced. A silicon oxide layer is generally used as the capacitor insulation layer 56. If the silicon oxide layer is too thin, the dielectric strength of the capacitor insulation layer 56 lowers. In this respect, the silicon nitride layer that has a greater dielectric strength than a silicon oxide layer is interposed between the silicon oxide layers to thereby reduce the thickness of the capacitor insulation layer 56 and increase the dielectric strength of the capacitor insulation layer 56.

The silicon oxide layer 11 is preferably formed by thermally oxidizing the lower electrode 54. The silicon oxide layer 11 has a preferred thickness of 10–30 nm. The silicon nitride layer 13 is preferably formed by a CVD method. The silicon nitride layer 13 has a preferred thickness of 10–20 nm. The silicon oxide layers 22aL and 20L are preferably formed by a thermal oxidation. The total thickness of the silicon oxide layers 22aL and 20L is preferably 1–5 nm. Therefore, the total thickness of the capacitor insulation layer 56 is preferably 21–55 nm. If the capacitor insulation layer 56 were to be made by a silicon oxide layer alone, the thickness TM of the capacitor insulation layer 56 would become to be 200–400 nm. This value is calculated based on a measured capacitance CM of the capacitor insulation layer 56, using the following formula:

$$C_M = \epsilon \epsilon_0 (S_M/T_M),$$

where $\epsilon_0$ is the dielectric constant of vacuum, $\epsilon$ is a dielectric constant of the silicon oxide layer (in this example, $\epsilon=3.9$), and SM is an area of the capacitor insulation layer 56.

The lower electrode 54 is preferably formed by steps other than those used to form the floating gate 40, the control gate 36, the gate electrode 30, the gate electrode 32 and the gate electrode 34. The lower electrode 54 is formed by the same step in which the resistor 520 is formed. The lower electrode 54 is an N⁺ type polysilicon layer. The lower electrode 54 preferably has a film thickness of 100–200 nm.

The upper electrode 58 is preferably formed by the same step in which the floating gate 40, the control gate 36, the gate electrode 30, the gate electrode 32 and the gate electrode 34 are formed. The upper electrode 58 is an N⁺ type polysilicon layer or a polycide layer. The polycide layer is formed from a polysilicon layer and a silicide layer (tungsten silicide layer, titanium silicide layer, or the like) formed over the polysilicon layer.

The upper electrode 58 preferably has a film thickness of 200–550 nm.

The silicon oxide layer 11 and the silicon nitride layer 13 are preferably formed by steps other than those used to form the gate insulation layers 26, 20, 22 and 24. On the other hand, the silicon oxide layer 22aL is preferably formed by the same step in which the silicon oxide layer 22a of the gate insulation layer 22 is formed. Also, the silicon oxide layer 20L is preferably formed by the same step in which the silicon oxide layer 50c of the intermediate layer 50, the gate insulation layer 20, the silicon oxide layer 22b of the gate insulation layer 22, the silicon oxide layer 24c of the gate insulation layer 24 are formed.

The resistor 520 is preferably formed by the same step in which the lower electrode 54 of the capacitor 540 is formed. The resistor 520 is an N⁺ type polysilicon layer. The resistor 520 has a preferred film thickness of 100–200 nm, and its sheet resistance can optionally be set at, for example, 60, 100 or 1 kΩ/ϵ. These sheet resistances can be adjusted, for example, by doping an impurity in the polysilicon layer.

An interlayer dielectric layer 800 is formed over the wafer in which the memory transistor 400, the first through the third voltage-type transistors 100, 200 and 300, the resistor 520 and the capacitor 540 are formed. The interlayer dielectric layer 800 defines contact holes that reach the sources 16, the drains 14, the gate electrode of each of the transistors 100, 200, 300 and 400, one end of the resistor 520, the other end of the resistor 520 and the upper electrode 58. Also, a contact hole that reaches the lower electrode 54 is formed, although this contact hole is not shown in this cross-sectional view. Contact conductive layers are formed in the contact holes. A wiring layer 80 having a predetermined pattern is formed on the interlayer dielectric layer 800. It is noted that FIG. 1 partially shows the contact conductive layers and wiring layers.

The semiconductor device of this embodiment has the first through the third transistor regions 1000, 2000 and 3000 in which the first through third voltage-type transistors 100, 200 and 300 that respectively operate at at least three different voltage levels (V1, V2 and V3) are formed. According to this semiconductor device, the memory transistor 400 in the memory region 4000 is operable. In the semiconductor device, not only logic for operating a flash EEPROM can be implemented, but also a flash EEPROM and other circuits that are operated at different voltage levels may be mixed and implemented in the same substrate to construct a system LSI. Such circuits include interface circuits, gate array circuits, memory circuits such as RAMs and ROMs and RISCs (reduced instruction set computer), or a variety of IP (Intellectual Property) macro circuits, or other digital circuits and analog circuits.

Embodiments including a method for operating a memory transistor, an embedded semiconductor device in which a semiconductor device is applied, and a method for manufacturing a semiconductor device shown in FIG. 1 will be described hereunder.

Next, a method for operating the memory transistor 400, that forms a semiconductor device in accordance with one embodiment of the present invention will be described.

For the operation of an embodiment of a memory transistor with a split-gate structure 400, a channel current is applied between the source 16 and the drain 14 to thereby inject a charge (hot electrons) in the floating gate 40 when data is written. When data is erased, a predetermined high voltage is applied to the control gate 36 to thereby transfer the charge stored in the floating gate 42 to the control gate 36 by the FN conduction. Each of the operations will be described below.

First, an example of a data-writing operation will be described. For the data-writing operation, the source 16 is set at a higher potential with respect to the drain 14, and a low potential is applied to the control gate 36. As a result, hot electrons that are generated under the floating gate 40 and near the drain 14 are accelerated toward the floating gate 40, and injected in the floating gate 40 through the gate insulation layer 26 to thereby accomplish the data-writing operation.

In the writing operation, for example, the control gate 36 is set at a potential (Vc) of 2 V, the source 16 is set at a potential (Vs) of 9 V, and the drain 14 is set at a potential (Vd) of 0 V. The well 12 is set at a potential (Vwell) of 0 V.

Next, an example of an erasing operation will be described. For the erasing operation, the control gate 36 is set at a potential higher than the potential of the source 16 and the drain 14. As a result, the charge stored in the floating gate 40 is discharged from the sharp upper edge section of the floating gate 40 by the FN conduction, passing through the intermediate insulation layer 50, to the control gate 36, whereby the data is erased.

In the erasing operation, for example, the control gate 36 is set at a potential (Vc) of 12 V, the source 16 and the drain 14 are set at potentials (Vs) and (Vd) of 0 V. The well 12 is set at a potential (Vwell) of 0 V.

Next, an example of a reading operation will be described. For the reading operation, the drain 14 is set at a higher potential than the source 16, and the control gate 36 is applied with a predetermined potential, whereby a determination is made based on the presence or the absence of a formed channel as to whether or not data is written. More specifically, when a charge is injected in the floating gate 40, the potential of the floating gate 40 becomes low, with the result that a channel is not formed and a drain current does not flow. On the other hand, when the floating gate 40 is not injected with a charge, the floating gate 40 has a high potential, with the result that a channel is formed and a drain current flows. By detecting a current flowing from the drain 14 by a sense amplifier, data in the memory transistor 400 can be read out.

In the reading operation, for example, the control gate 36 is set at a potential (Vc) of 3 V, the source 16 is set at a potential (Vs) of 0 V, and the drain 14 is set at a potential (Vd) of 2 V. The well 12 is set at a potential (Vwell) of 0 V.

The operations described above are examples, and other operational conditions are also applicable in accordance with other embodiments. For example, Table 1 below sets forth a range of voltages according to one embodiment for write, erase and read operations.

TABLE 1

Range of voltages for write, erase and read operations according to one embodiment.

|  | control gate (V) | source (V) | drain (V) |
|---|---|---|---|
| write | 0.5–3 | 8–11 | 0 |
| erase | 10–14 | 0 | 0 |
| read | 1–5 | 0 | 1–5 |

Figure 21:
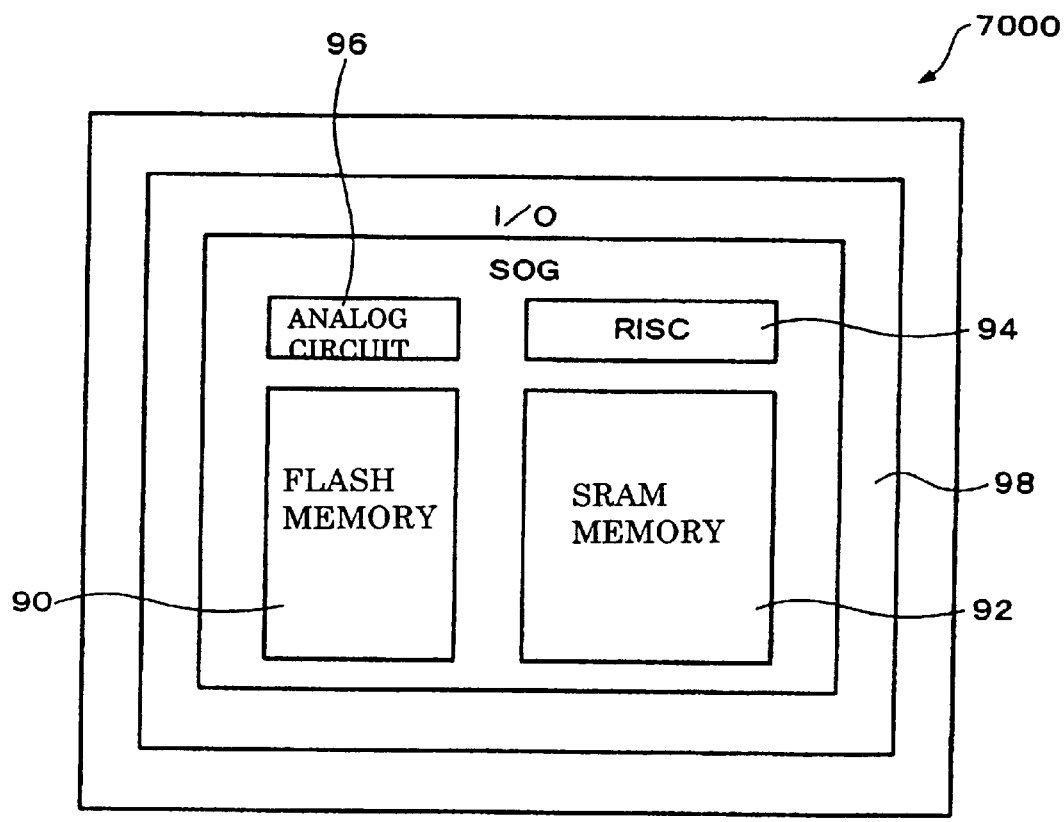
FIG. 21 is a schematic plan view of an embedded semiconductor device employing a semiconductor device in accordance with one embodiment of the present invention.

FIG. 21 schematically shows a layout of an embedded semiconductor device 7000 in which a semiconductor device according to an embodiment of the present invention is implemented. In accordance with this embodiment, the embedded semiconductor device 7000 includes a flash-memory (flash EEPROM) 90, an SRAM memory 92, a RISC 94, an analog circuit 96 and an interface circuit 98 that are mixed and mounted in an SOG (sea of gates) structure.

Figure 22:
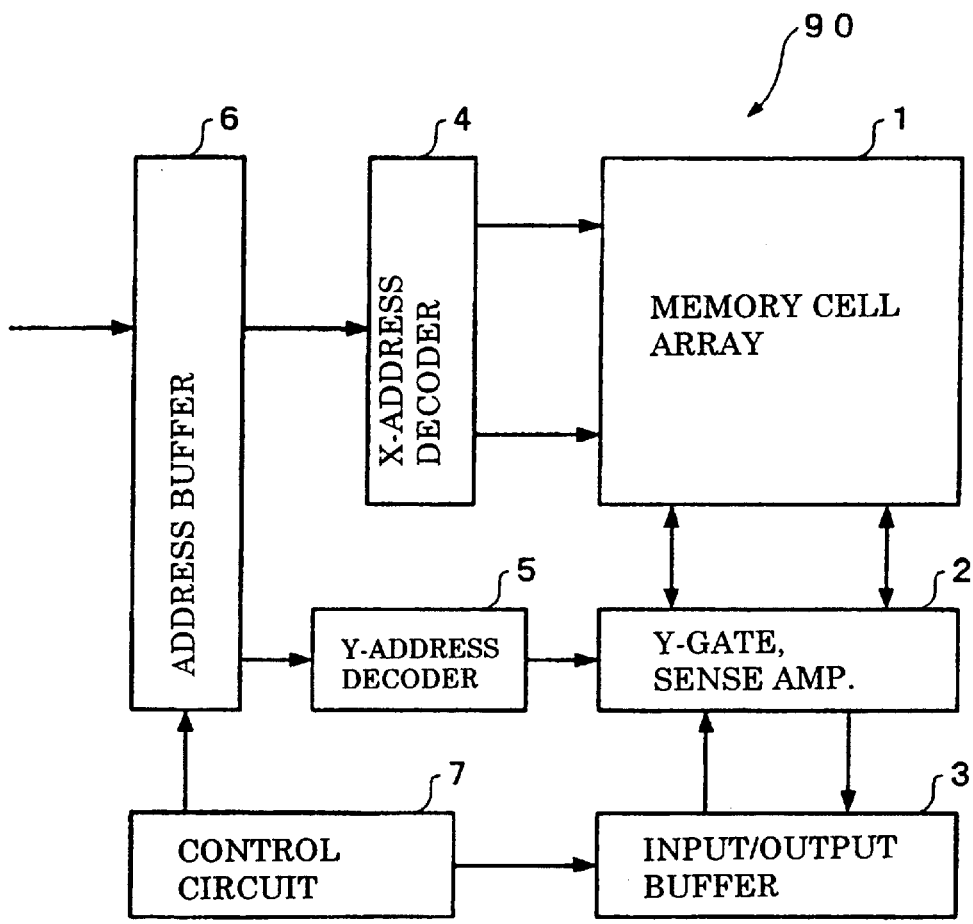
FIG. 22 shows a block diagram of a flash-memory of the embedded semiconductor device shown in FIG. 21.

FIG. 22 shows a block diagram of a common structure of a flash-memory. The flash-memory includes a memory cell array 1 in which memory transistors are disposed in an array, a Y-gate, sense amplifier 2, an input/output buffer 3, an X-address decoder 4, a Y-address decoder 5, an address buffer 6 and a control circuit 7.

The memory cell array 1 corresponds to the memory region 4000 shown in FIG. 1 and has a plurality of split-gate type memory transistors 400 disposed in a matrix. The memory cell array 1 connects to the X-address decoder 4 and the Y-gate 2 in order to select rows and columns of the memory cell array 1. The Y-gate 2 connects to the Y-address decoder 5 that provides column selection data. The X-address decoder 4 and the Y-address decoder 5 connect to the address buffer 6 that temporarily stores address data.

The Y-gate 2 connects to a write-voltage generation circuit (not shown) for conducting a data-wiring operation, and to a sense amplifier for conducting a data-reading operation. The X-address decoder connects to an erasing-voltage generation circuit for conducting a data-erasing operation. The write-voltage generation circuit and the sense amplifier 2 connect to the input/output buffer 3 that temporarily stores input and output data. The address buffer 6 and the input/output buffer 3 connect to the control circuit 7 that controls the operation of the flash-memories. The control circuit 7 performs the control operation based on chip enable signals, output enable signals and program signals.

In the embedded semiconductor device 7000, transistors operable at different voltage levels are selected depending on the operation voltages of the respective circuits.

The first voltage-type transistor 100 that is operated at a first voltage level is included in, for example, at least one of the Y-gate, sense amplifier, the input/output buffer, the X-address decoder, the Y-address decoder, the address buffer, the control circuit, the SOG and the gate array.

The second voltage-type transistor 200 that is operated at a second voltage is included in, for example, at least one of the Y-gate, sense amplifier, the input/output buffer, the X-address decoder, the Y-address decoder and the interface circuit.

The third voltage-type transistor 300 that is operated at a third voltage is included in, for example, at least one of the writing-voltage generation circuit, the erasing-voltage generation circuit and the step-up circuit.

FIG. 21 shows an example of a layout of the embedded semiconductor device 5000. The present invention is applicable to various types of system LSIs.

Next, a method for manufacturing a semiconductor device such as that shown in FIG. 1 in accordance with one embodiment of the present invention will be described with reference to FIG. 2 through FIG. 19.

Figure 2:
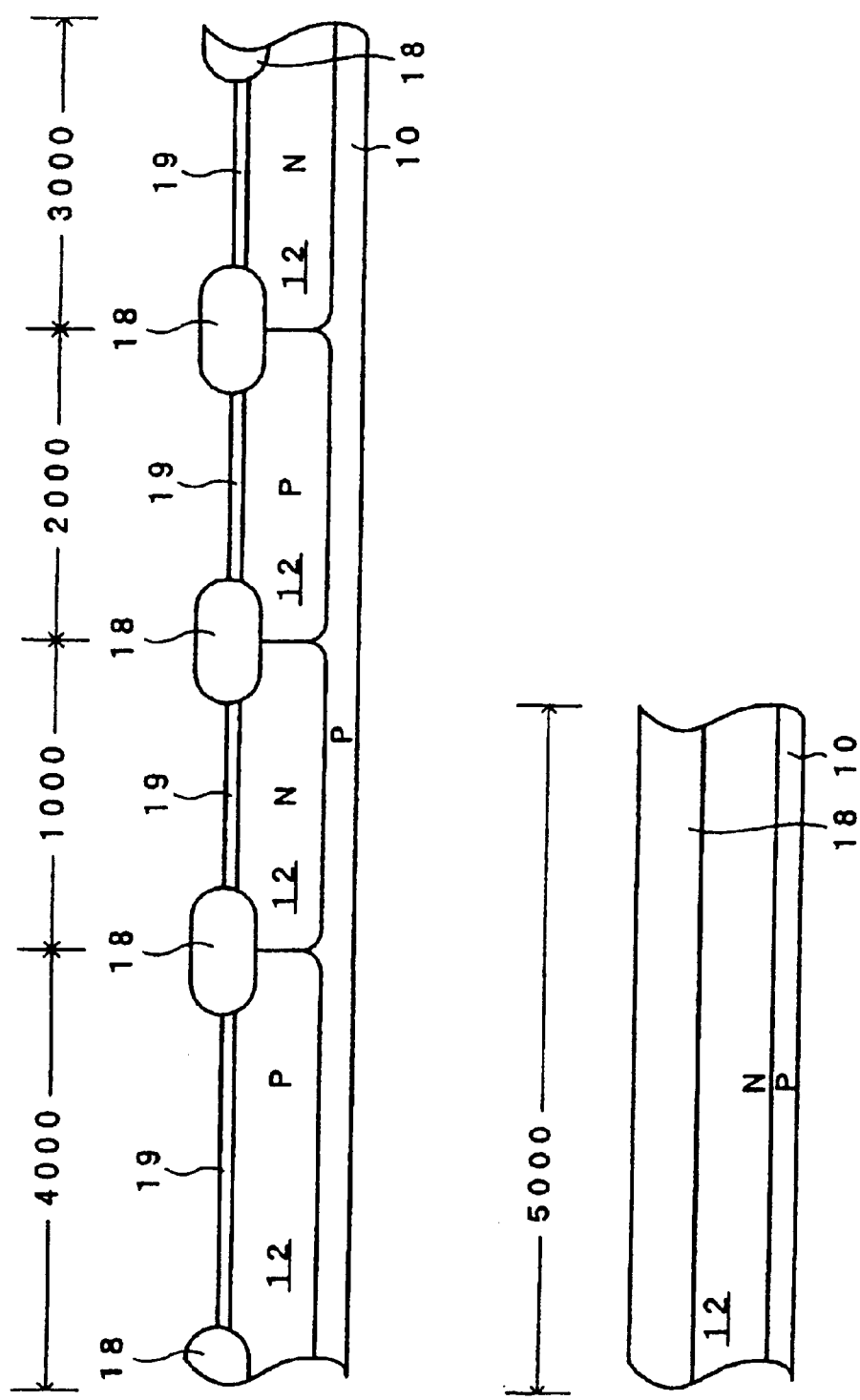
FIG. 2 is a cross-sectional view of a wafer in a first step of forming the semiconductor device shown in FIG. 1.

(A) First, as shown in FIG. 2, field insulation layers 18 are formed over the surface of a P-type silicon substrate 10 in predetermined regions thereof by a selective oxidation method. The field insulation layers 18 are formed in predetermined regions in the memory region 4000, the first transistor region 1000, the second transistor region 2000, the third transistor region 3000, and the analog circuit region 5000.

Furthermore, oxide layers having a preferred film thickness of 10–40 nm are formed over the surfaces of the P-type silicon substrate 10 between the field insulation layers 18 in the memory region 4000, the first transistor region 1000, the second transistor region 2000 and the third transistor region 3000. Then, a P-type impurity (for example, boron) or an N-type impurity (arsenic or phosphorous) is doped in the P-type silicon substrate 10 to thereby form P-type wells or N-type wells 12 in predetermined regions of the substrate 10 in the in the memory region 4000, the first transistor region 1000, the second transistor region 2000, the third transistor region 3000 and the analog circuit region 5000.

Figure 3:
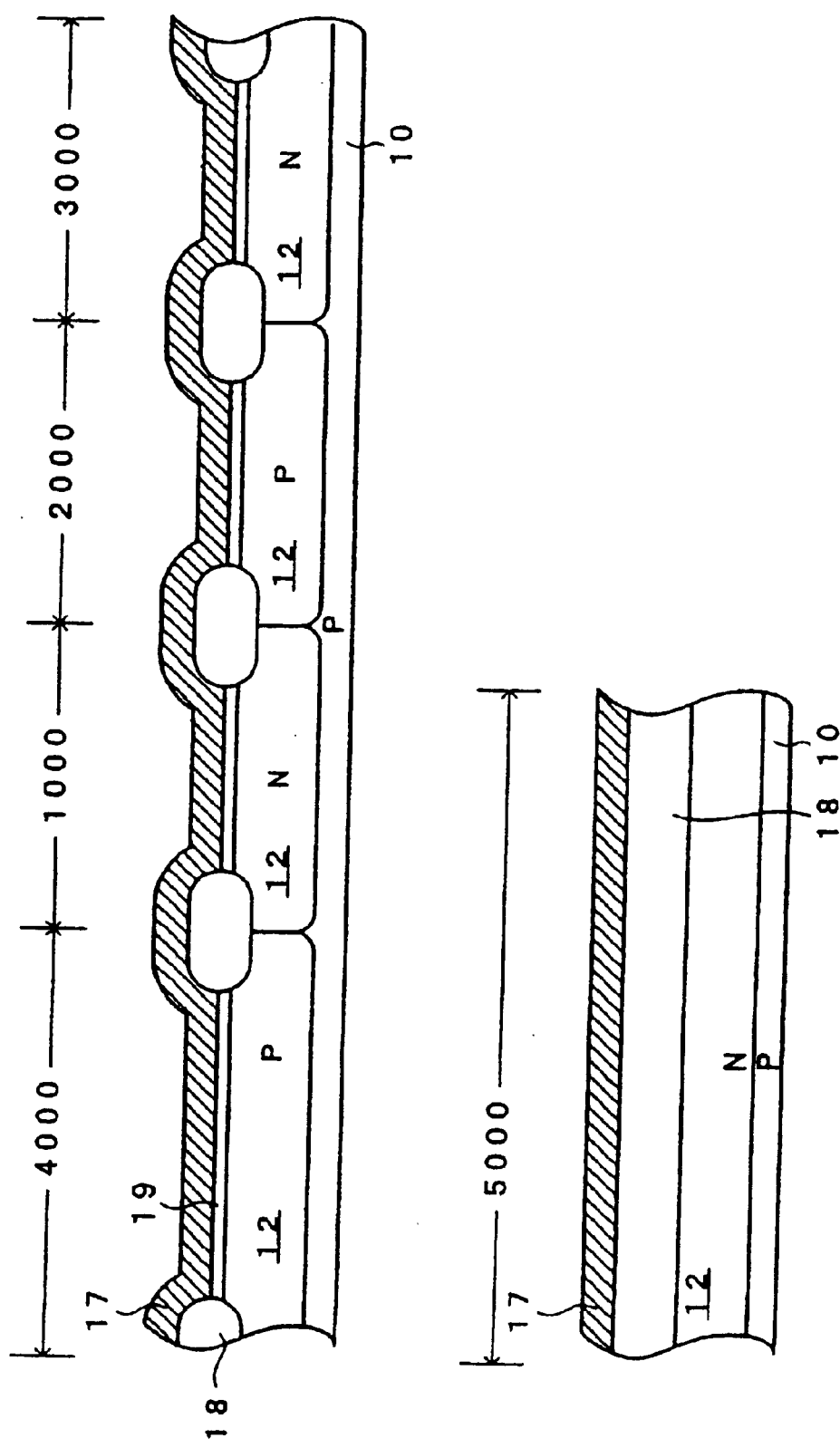
FIG. 3 is a cross-sectional view of the wafer in a second step of forming the semiconductor device shown in FIG. 1.

(B) Then, as shown in FIG. 3, a polysilicon layer 17 is formed over the surface of the P-type silicon substrate 10 by, for example, a CVD method. The polysilicon layer 17 becomes a resistor and a lower electrode of a capacitor. The polysilicon layer 17 may preferably have a thickness of 100–200 nm.

Then, phosphorous ions are implanted in the polysilicon layer 17 to thereby dope the phosphorous in the polysilicon layer 17 to set the polysilicon layer 17 at a required sheet resistance.

Figure 4:
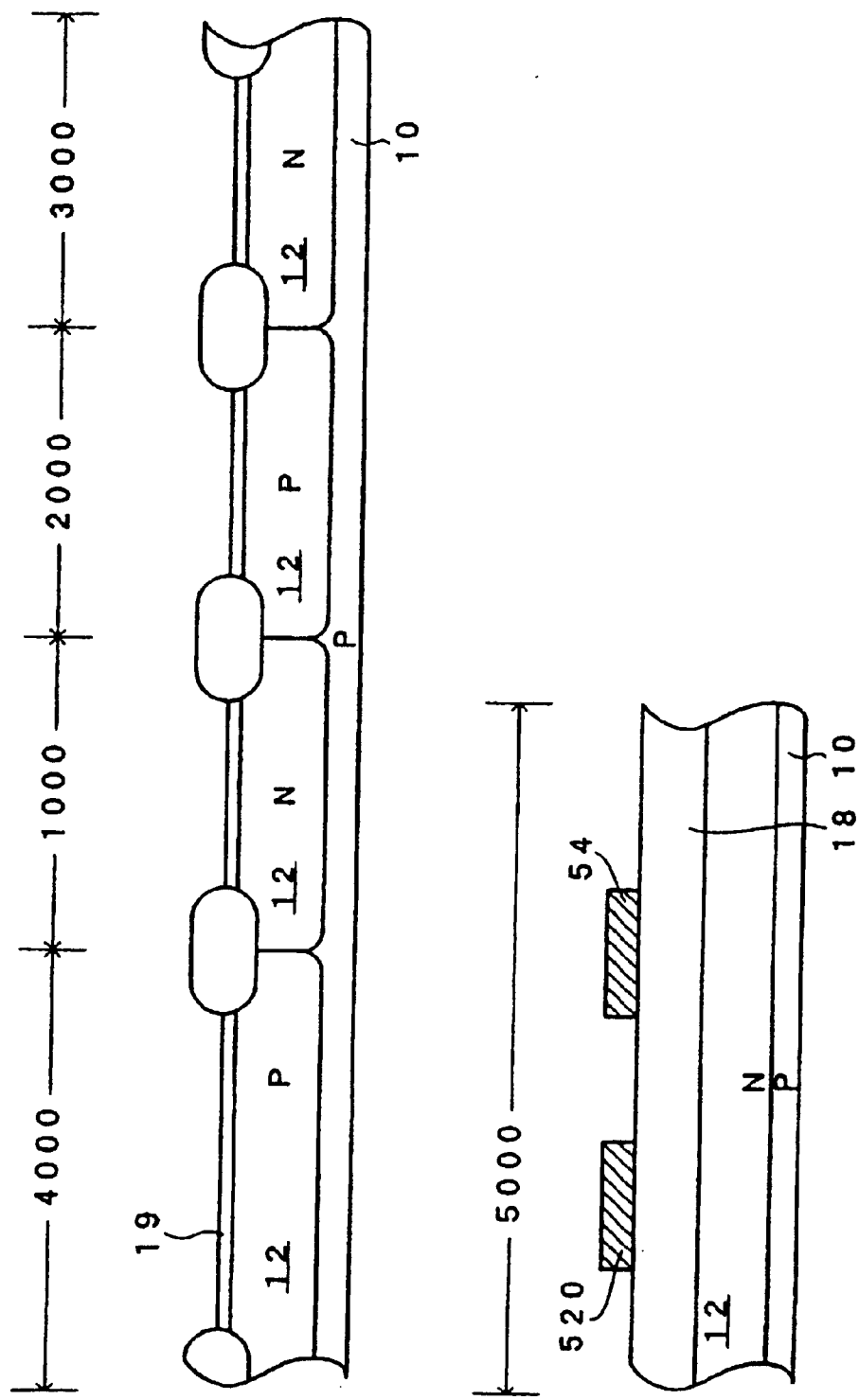
FIG. 4 is a cross-sectional view of the wafer in a third step of forming the semiconductor device shown in FIG. 1.

(C) Then, as shown in FIG. 4, the polysilicon layer 17 is selectively removed by photolithography and etching, to thereby form the resistor 520 and the lower electrode 54 of the capacitor in the analog circuit region 5000.

Figure 5:
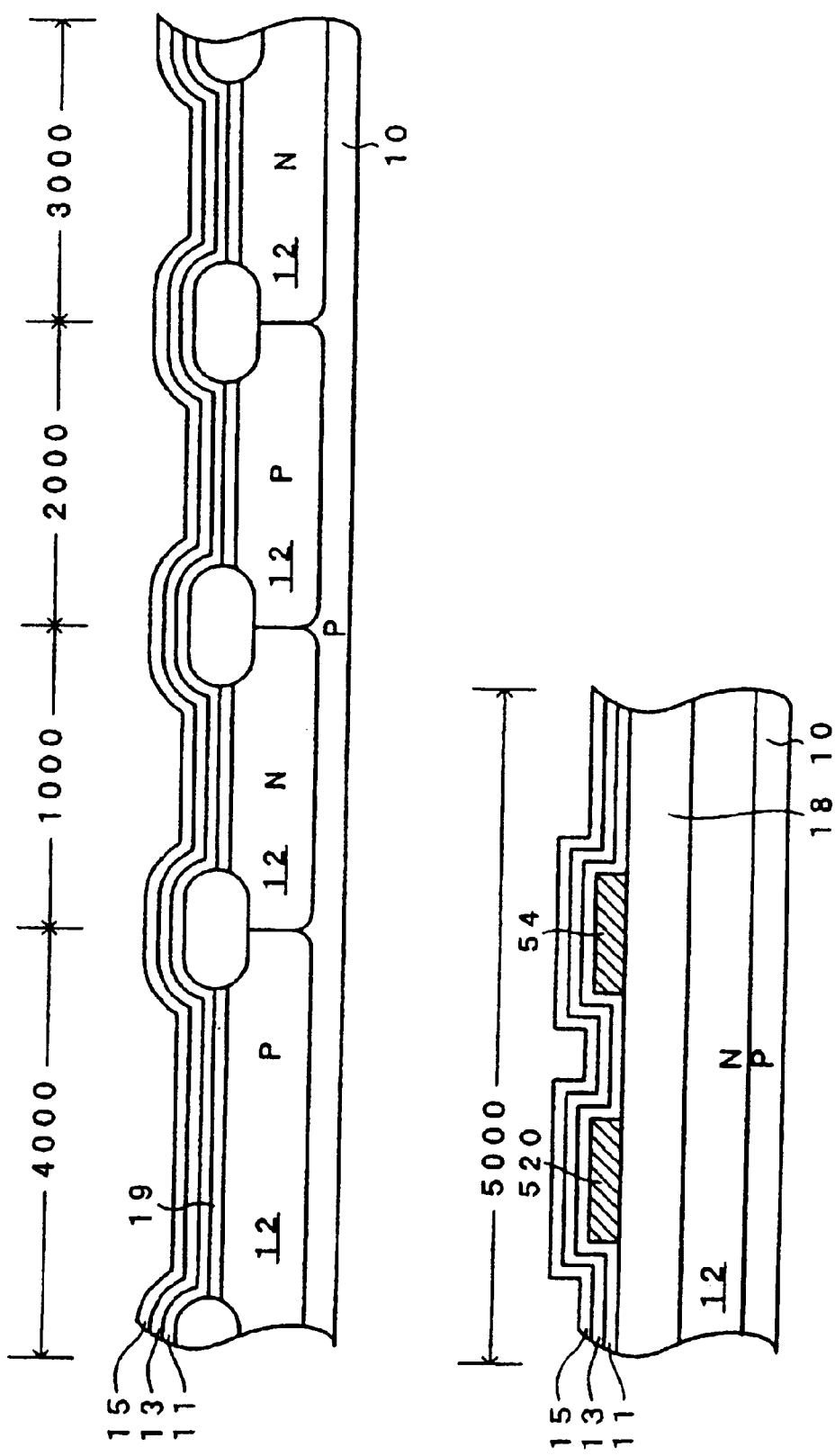
FIG. 5 is a cross-sectional view of the wafer in a fourth step of forming the semiconductor device shown in FIG. 1.

(D) Then, as shown in FIG. 5, a silicon oxide layer 11 is formed over the P-type silicon substrate 10 by, for example, a thermal oxidation method. The silicon oxide layer 11 forms a lower layer of the capacitor insulation layer. The silicon oxide layer 11 has a preferred film thickness of 10–30 nm.

Then, a silicon nitride layer 13 is formed over the surface of the silicon oxide layer 11 by a CVD method, for example. The silicon nitride layer 13 forms an intermediate layer of the capacitor insulation layer. The silicon nitride layer 13 has a preferred film thickness of 10–20 nm.

Then, a silicon oxide layer 15 is formed over the surface of the silicon nitride layer 13 by a CVD method, for example. The silicon oxide layer 15 is formed to protect the silicon oxide layer 11 and the silicon nitride layer 13. In other words, a transistor is formed in succeeding steps to be conducted later. Therefore, the silicon oxide layer 15 is formed to protect the silicon oxide layer 11 and the silicon nitride layer 13 from damages that may be caused by a thermal oxidation, a step of forming a silicon nitride layer, and an etching step to be conducted in the formation of the transistor.

The silicon oxide layer 15 is, for example, a TEOS film and a high temperature CVD oxidation layer (HTO). The silicon oxide layer 15 has a preferred film thickness of 50–100 nm. This thickness is sufficient for the silicon oxide layer 15 to remain even after a wet etching process is conducted in a later step (F) that will be described below.

Figure 6:
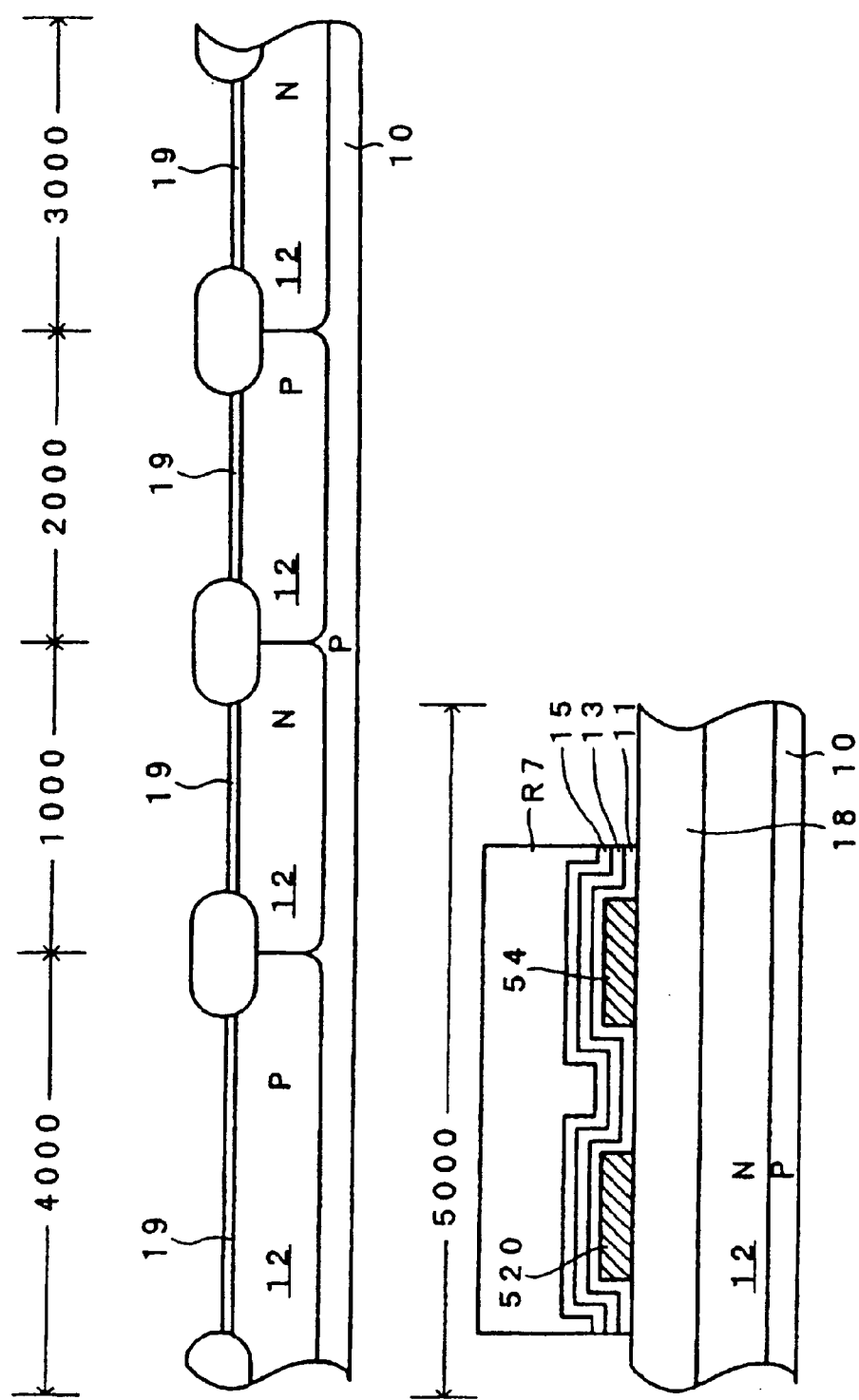
FIG. 6 is a cross-sectional view of the wafer in a fifth step of forming the semiconductor device shown in FIG. 1.

(E) Then, as shown in FIG. 6, a resist layer R7 is formed in the analog circuit region 5000. The silicon oxide layer 15, the silicon nitride layer 13 and the silicon oxide layer 11 are selectively etched and removed, using the resist layer R7 as a mask. As a result, these layers remain in a manner to cover the lower electrode 54 and the resistor 520. Since these layers remain on the resistor 520, the polysilicon layer of the resistor 520 is protected from damages that may be caused in succeeding steps by, for example, an etching step and an oxidation step.

It is noted that in certain embodiments, the resistor forming region in the analog circuit region 5000 may not be covered by the resist layer R7, and instead, the capacitor forming region may be covered by the resist layer R7. The resistor 520 is exposed when the silicon oxide layer 15, the silicon nitride layer 13 and the silicon oxide layer 11 are selectively etched, using the resist layer R7 as a mask.

Figure 7:
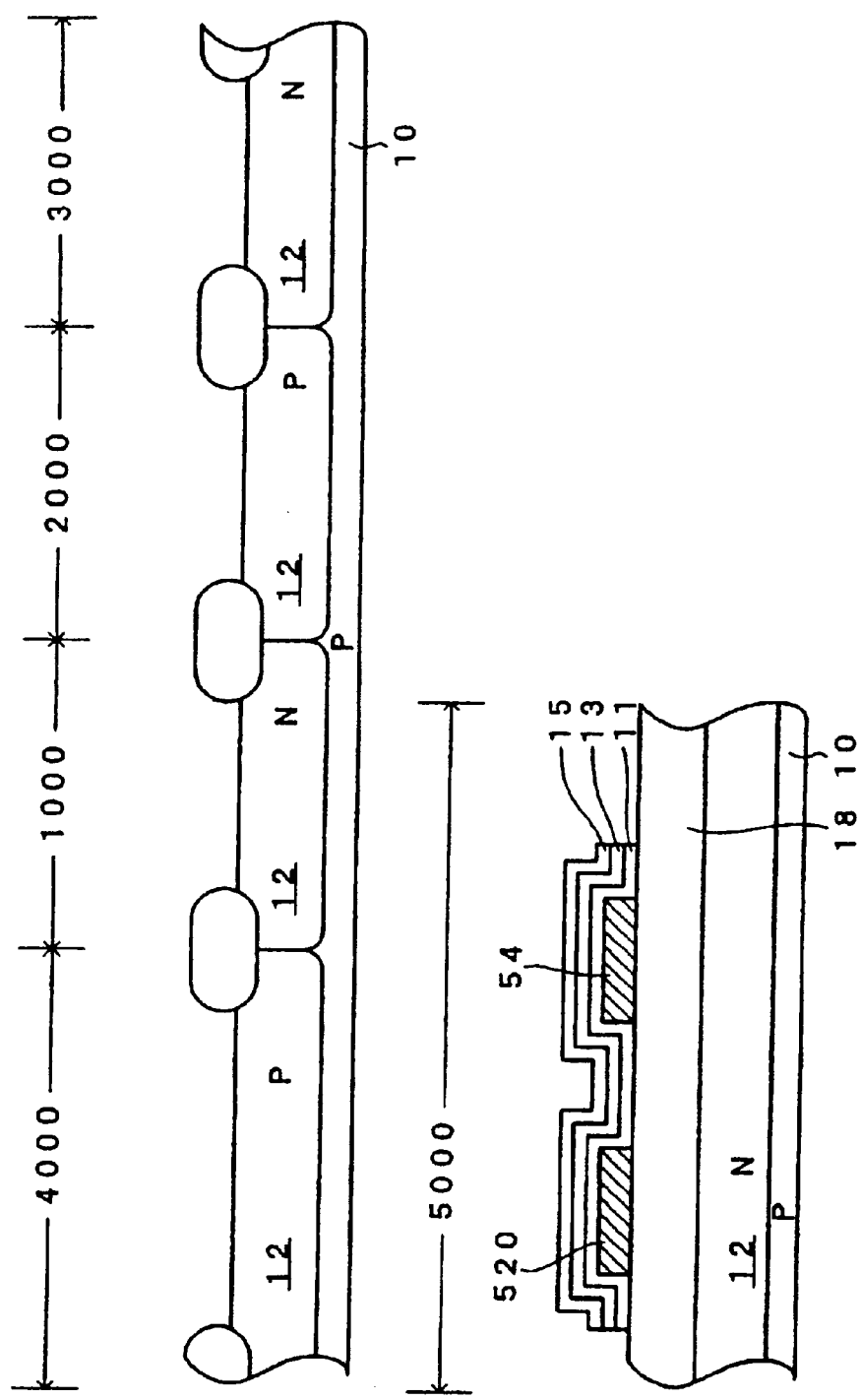
FIG. 7 is a cross-sectional view of the wafer in a sixth step of forming the semiconductor device shown in FIG. 1.

(F) Then, as shown in FIG. 7, the oxide layer 19 is removed, preferably by a wet-etching to thereby expose surfaces of the P-type silicon substrate 10 in the memory region 4000, the first transistor region 1000, the second transistor region 2000, and the third transistor region 3000. It is noted that since the silicon oxide layer 15 is exposed, the silicon oxide layer 15 is etched in the wet-etching step. As described in the section (D) above, the silicon oxide layer 15 is formed to protect the silicon oxide layer 11 and the silicon nitride layer 13. Therefore, the silicon oxide layer 15 needs to have a thickness sufficient for the silicon oxide layer 15 to remain even after the wet-etching step.

Figure 8:
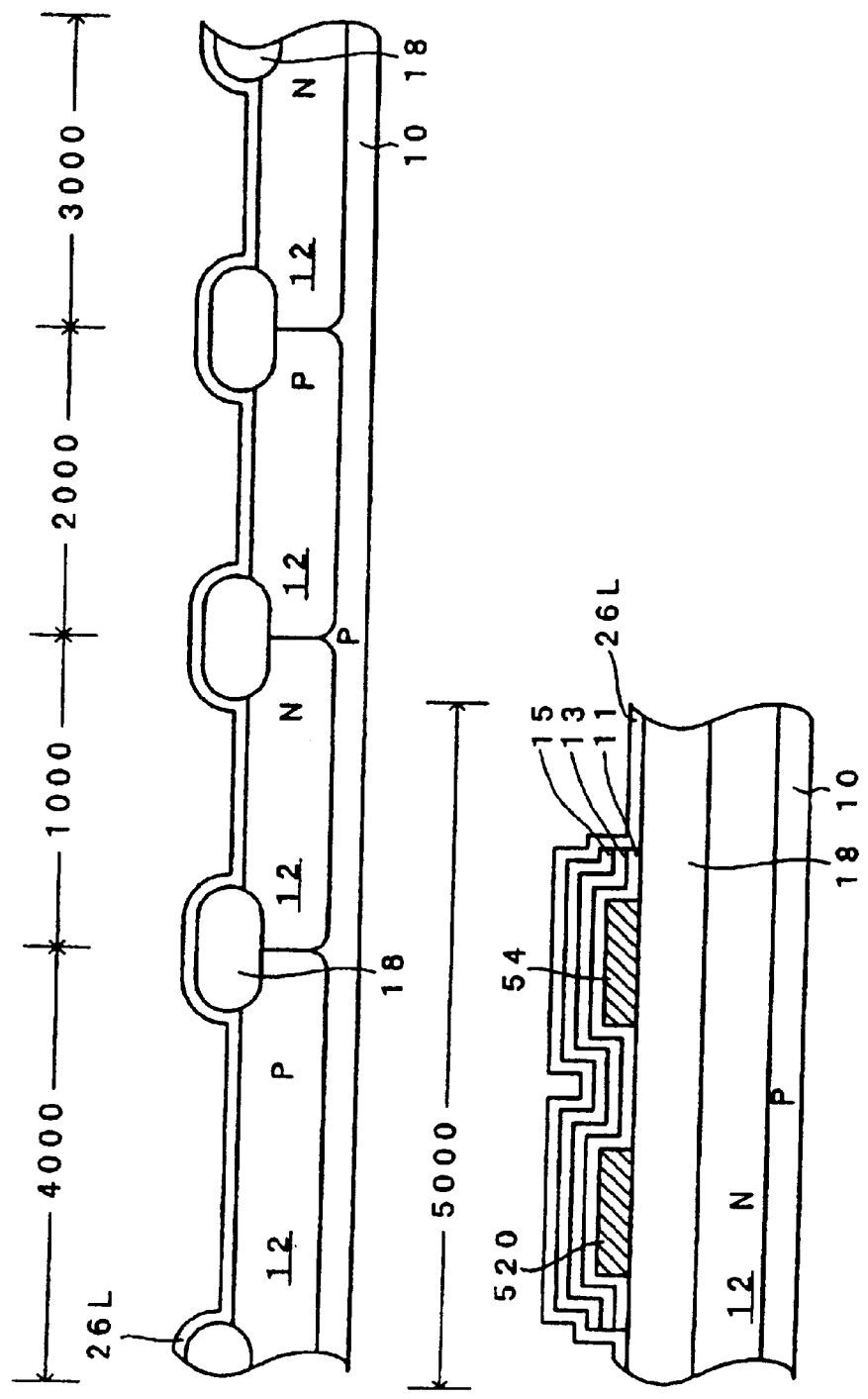
FIG. 8 is a cross-sectional view of the wafer in a seventh step of forming the semiconductor device shown in FIG. 1.

(G) Then, as shown in FIG. 8, a silicon oxide layer 26L is formed over the surface of the P-type silicon substrate 10 by a thermal oxidation method, for example. The silicon oxide layer 26L becomes a gate insulation layer 26 of the memory transistor 400. The silicon oxide layer 26L may preferably have a thickness of 6–9 nm, in consideration of the dielectric strength of the gate.

Figure 9:
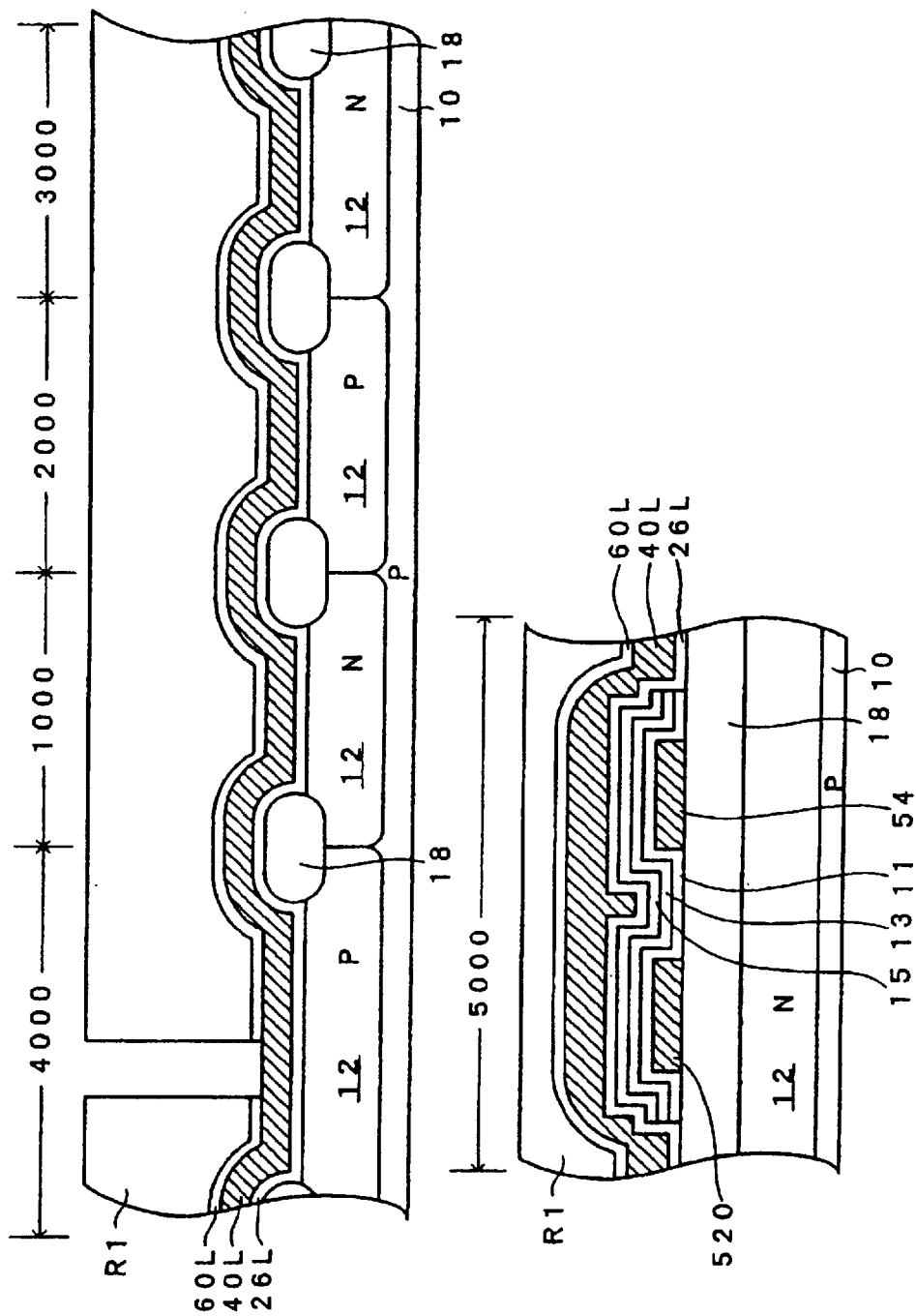
FIG. 9 is a cross-sectional view of the wafer in an eighth step of forming the semiconductor device shown in FIG. 1.

(H) Then, as shown in FIG. 9, a polysilicon layer 40L is formed over the surface of the silicon oxide layer 26L by a CVD method, for example. The polysilicon layer 40L becomes a floating gate 40 of the memory transistor 400. The polysilicon layer 40L has a thickness of 100–200 nm, for example.

Then, a silicon nitride layer 60L is formed over the surface of the polysilicon layer 40L. The polysilicon layer 60L may preferably have a film thickness of 50–150 nm. Then, a predetermined area of the silicon nitride layer 60L is selectively etched and removed, using a resist R1 as a mask. The area of the silicon nitride layer 60L that is removed corresponds to a region where a selective oxide insulation layer 42 of the memory transistor 400 is formed.

Then, phosphorous or arsenic is diffused in the polysilicon layer 40L, using the resist layer R1 formed on the first silicon nitride layer 60L as a mask, to form an N-type polysilicon layer 40L. The polysilicon layer may be changed to an N-type by other methods. For example, after the polysilicon layer is formed, the polysilicon layer is implanted with phosphorous ions or arsenic ions. Alternatively, after the polysilicon layer is formed, the polysilicon layer is contacted with a carrier gas containing phosphoryl chloride (POCl$_3$). Alternatively, when the polysilicon layer is formed, the layer is contacted with a carrier gas containing phosphine (PH$_3$).

Then, the resist layer RI is removed.

Figure 10:
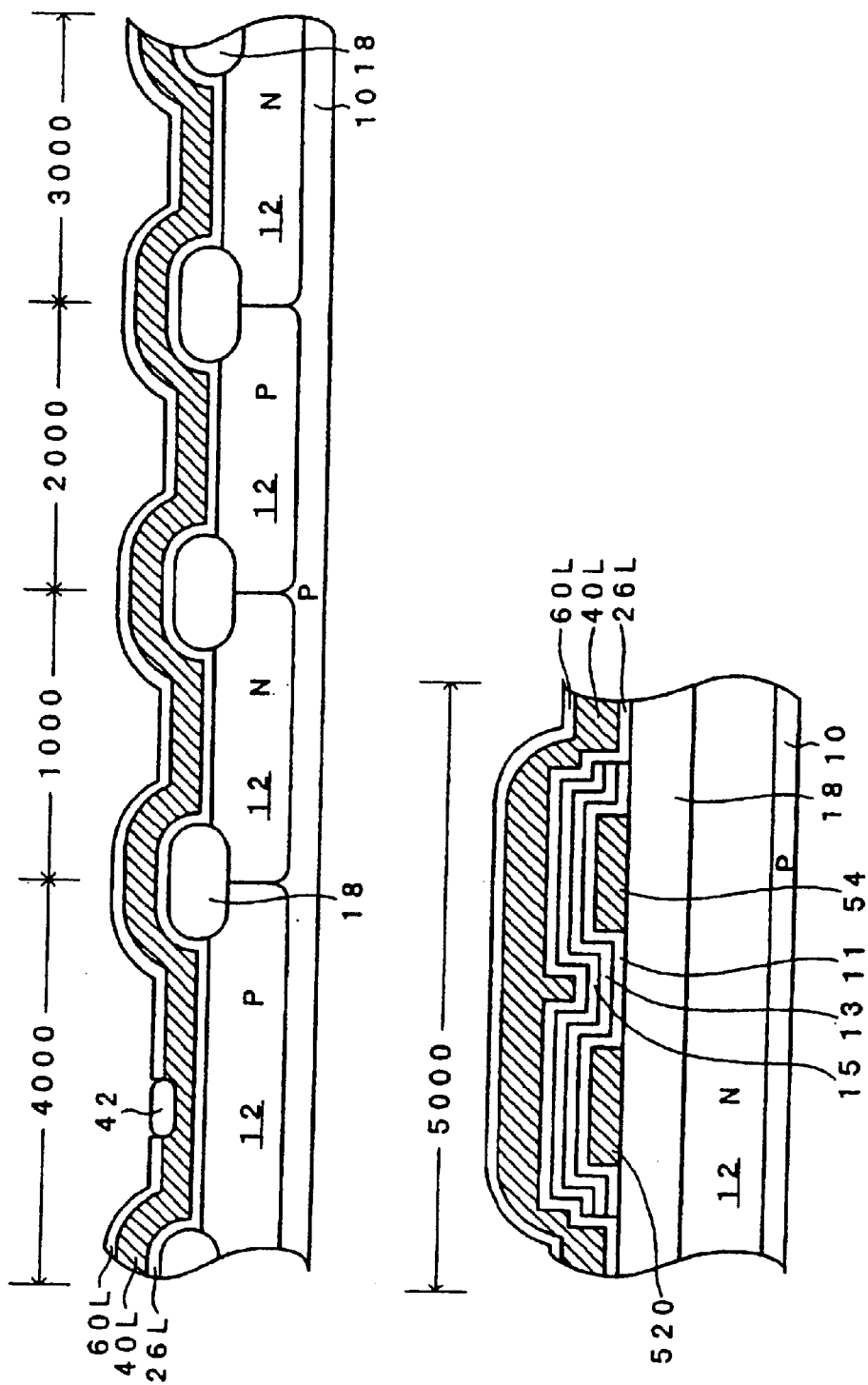
FIG. 10 is a cross-sectional view of the wafer in a ninth step of forming the semiconductor device shown in FIG. 1.

(I) Next, as shown in FIG. 10, an exposed portion in the polysilicon layer 40L is selectively oxidized to form a selective oxide insulation layer 42 on the surface of the polysilicon layer 40L in a predetermined region thereof. The selective oxide insulation layer 42 formed by the selective oxidation preferably has a maximum film thickness at its central area, and gradually becomes thinner toward end sections thereof. The selective oxide insulation layer 42 may preferably have a film thickness of 100–200 nm at the thickest portion. Then, the first silicon nitride layer 60L is removed.

Figure 11:
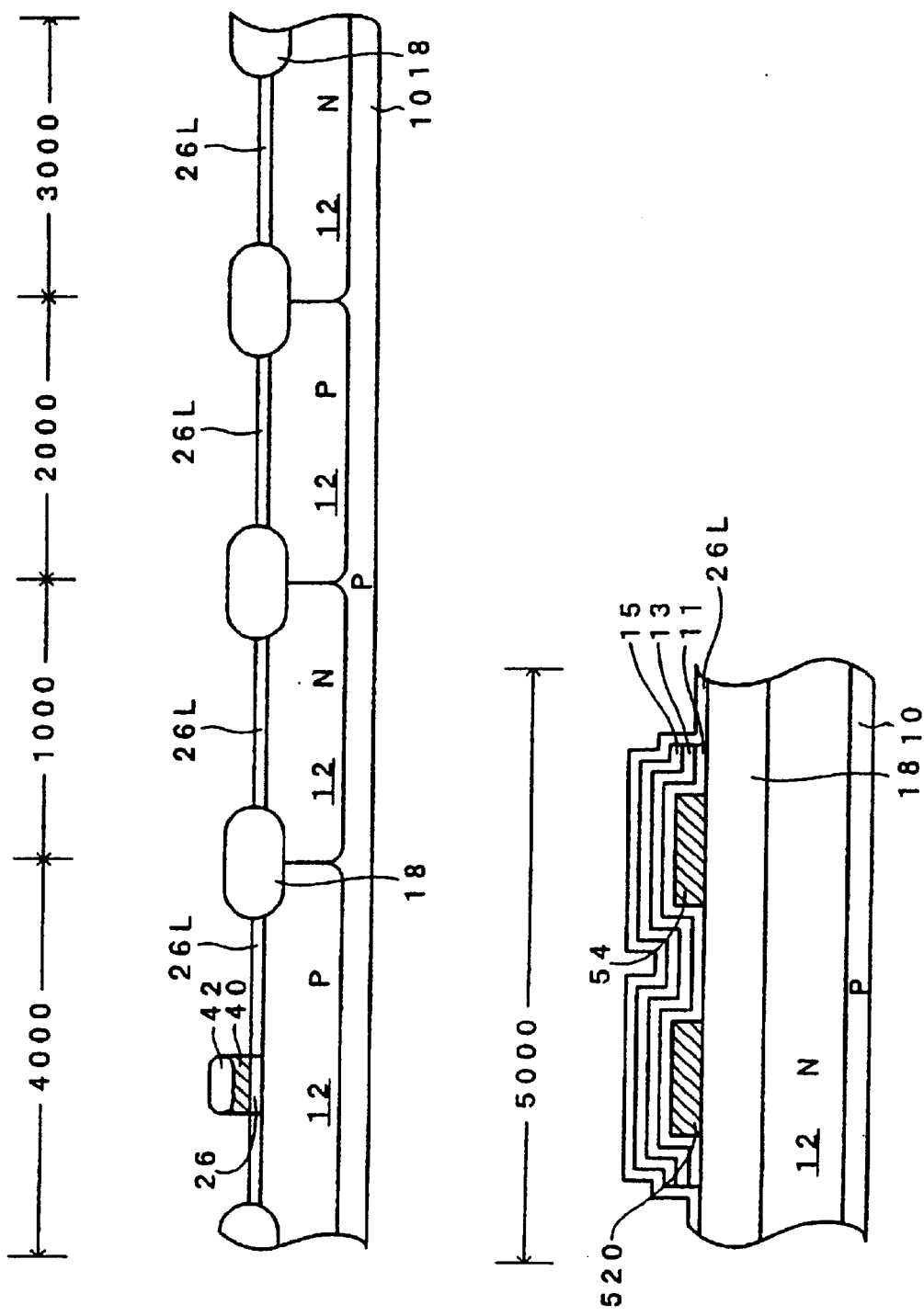
FIG. 11 is a cross-sectional view of the wafer in a tenth step of forming the semiconductor device shown in FIG. 1.

(J) Next, as shown in FIG. 11, an etching is conducted, using the selective oxide insulation layer 42 as a mask, to selectively remove the silicon nitride layer 60L and the polysilicon layer 40L.

By the steps described above, the gate insulation layer 26, the floating gate 40 and the selective oxide insulation layer 42 are formed in the memory region 4000.

Figure 12:
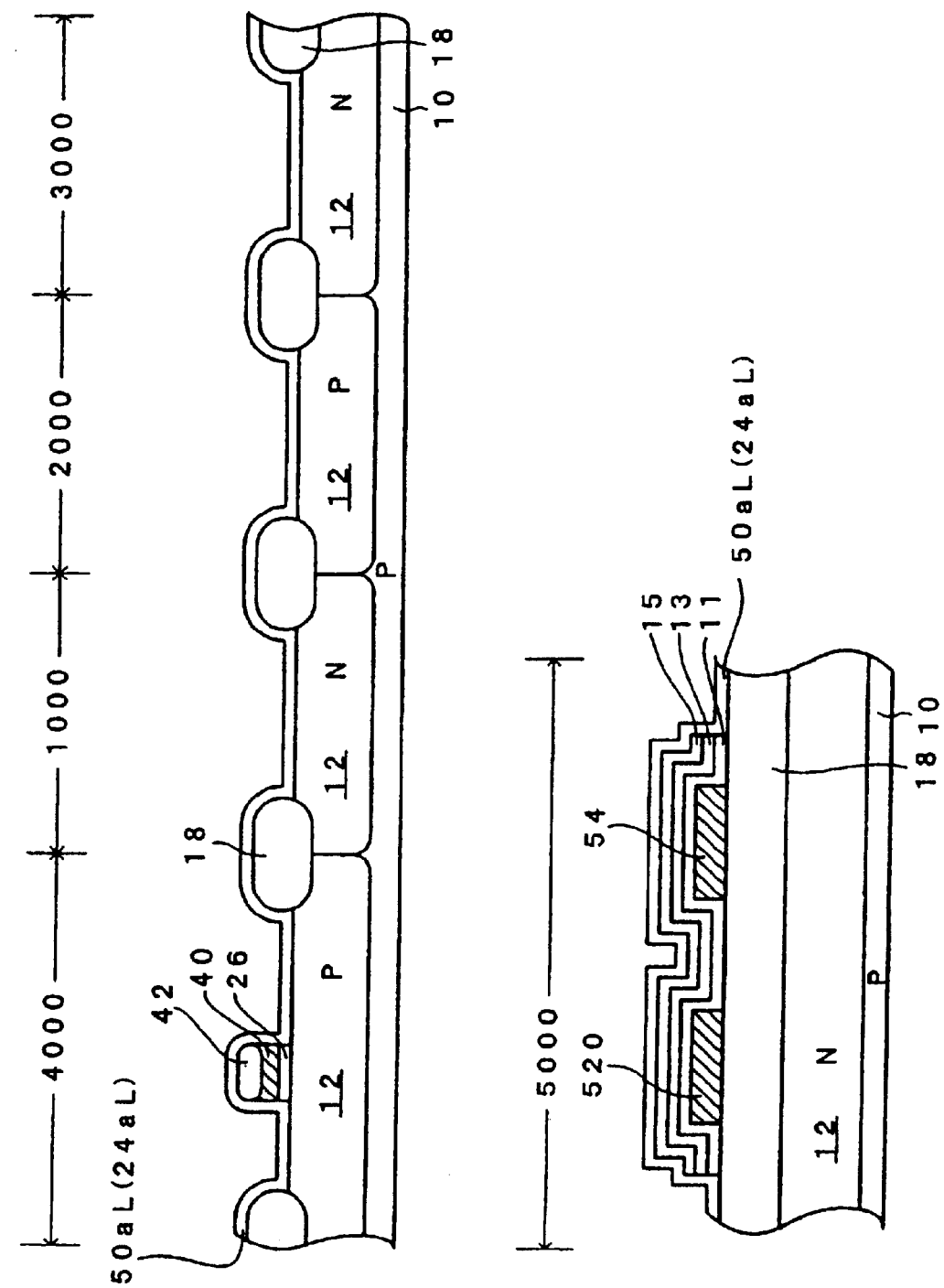
FIG. 12 is a cross-sectional view of the wafer in an eleventh step of forming the semiconductor device shown in FIG. 1.

(K) Then, as shown in FIG. 12, the silicon oxide layer 26L is removed by a wet-etching, and then a first silicon oxide layer 50aL (24aL) is formed over the surface of the wafer by a thermal oxidation method. The silicon oxide layer 50aL (24aL) becomes a silicon oxide layer 50a that forms an intermediate insulation layer 50 of the memory transistor 400, and a silicon oxide layer 24a that forms a gate insulation layer 24 of the third voltage-type transistor 300. The silicon oxide layer 50aL (24aL) may preferably have a thickness of 5–15 nm, for example.

Any one of the following thermal oxidation methods may preferably be conducted to form the silicon oxide layer.

(a) A dry-oxidation is conducted at 700–1000° C.
(b) After the dry-oxidation conducted in the method (a), a wet-oxidation is further conducted at 700–1000° C.
(c) After the above methods (a) or (b), an anneal treatment is conducted in a nitrogen atmosphere at 700–1000° C. for 10–30 minutes.

By conducting the dry-oxidation in the method (a) described above, the size of polysilicon grains on the surface of the floating gate 40 becomes uniform, and the planarization of the surface of the floating gate 40 is improved. As a result, the interface state of the floating gate 40 becomes more stabilized, the electron capturing is reduced, and the cycle life of write/erase operations of the memory transistor is extended.

Further, when at least one of the wet-oxidation in the method (b) and the anneal treatment in the method (c) is added after the dry-oxidation in the method (a), the silicon oxide layer 50aL is further densified, and the electron capturing is reduced, such that the film characteristics can be improved.

Figure 13:
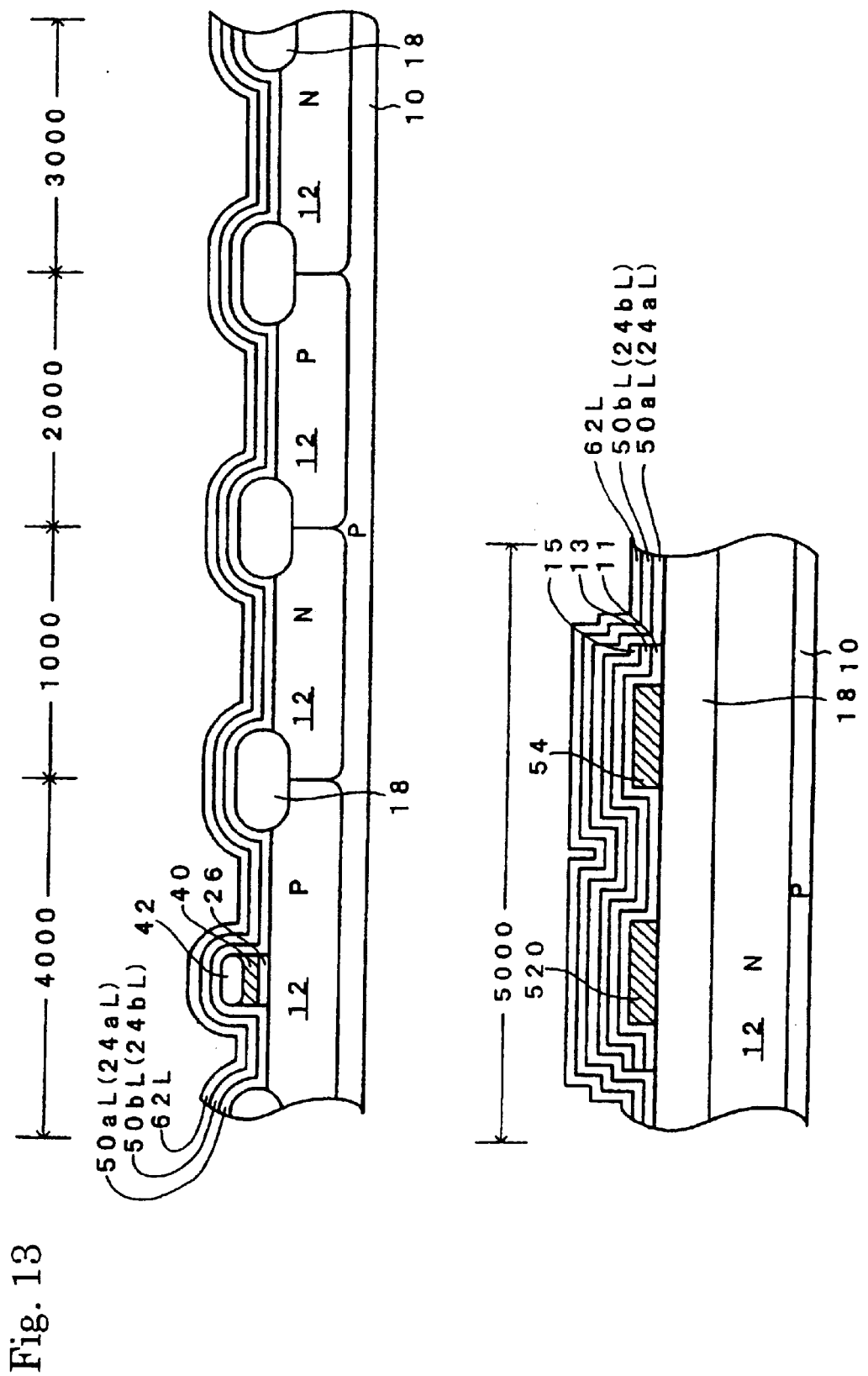
FIG. 13 is a cross-sectional view of the wafer in a twelfth step of forming the semiconductor device shown in FIG. 1.

Then, as shown in FIG. 13, a second silicon oxide layer 50bL (24bL) is further formed over the surface of the first silicon oxide layer 50aL (24aL). The second silicon oxide layer 50bL (24bL) is formed by a CVD method. The second silicon oxide layer 50bL (24bL) becomes a silicon oxide layer 50b that forms an intermediate insulation layer 50 of the memory transistor 400, and a silicon oxide layer 24b that forms a gate insulation layer 24 of the third voltage-type transistor 300. The silicon insulation layer 50bL (24bL) has a thickness of 10–20 nm, for example.

Considering the density of the formed film, the permeability resistance against oxygen ions and the like in a thermal oxidation to be performed in a later stage, the CVD method used in this embodiment may preferably be conducted by the HTO (high temperature oxide) method, using monosilane or tetraethylorthosilicate, the TEOS (tetraethyl orthosilicate) method, using ozone as an oxidation agent, or the plasma TEOS method.

Then, a silicon nitride layer 62L is formed over the surface of the silicon oxide layer 50bL (24bL). The silicon nitride layer 62L may preferably have a film thickness of 10–20 nm. Due to the silicon nitride layer 62L thus formed, although the silicon nitride layer 62 L will be removed in step (I) that is later performed, the intermediate insulation layer 50 of the memory transistor 400 and the gate insulation layer 24 of the third voltage-type transistor 300 do not unnecessary become thick, and thus the film thickness can be precisely controlled. Then, an anneal treatment may be conducted at 700–1000° C. for about 20–40 minutes to densify the insulation layers.

Figure 14:
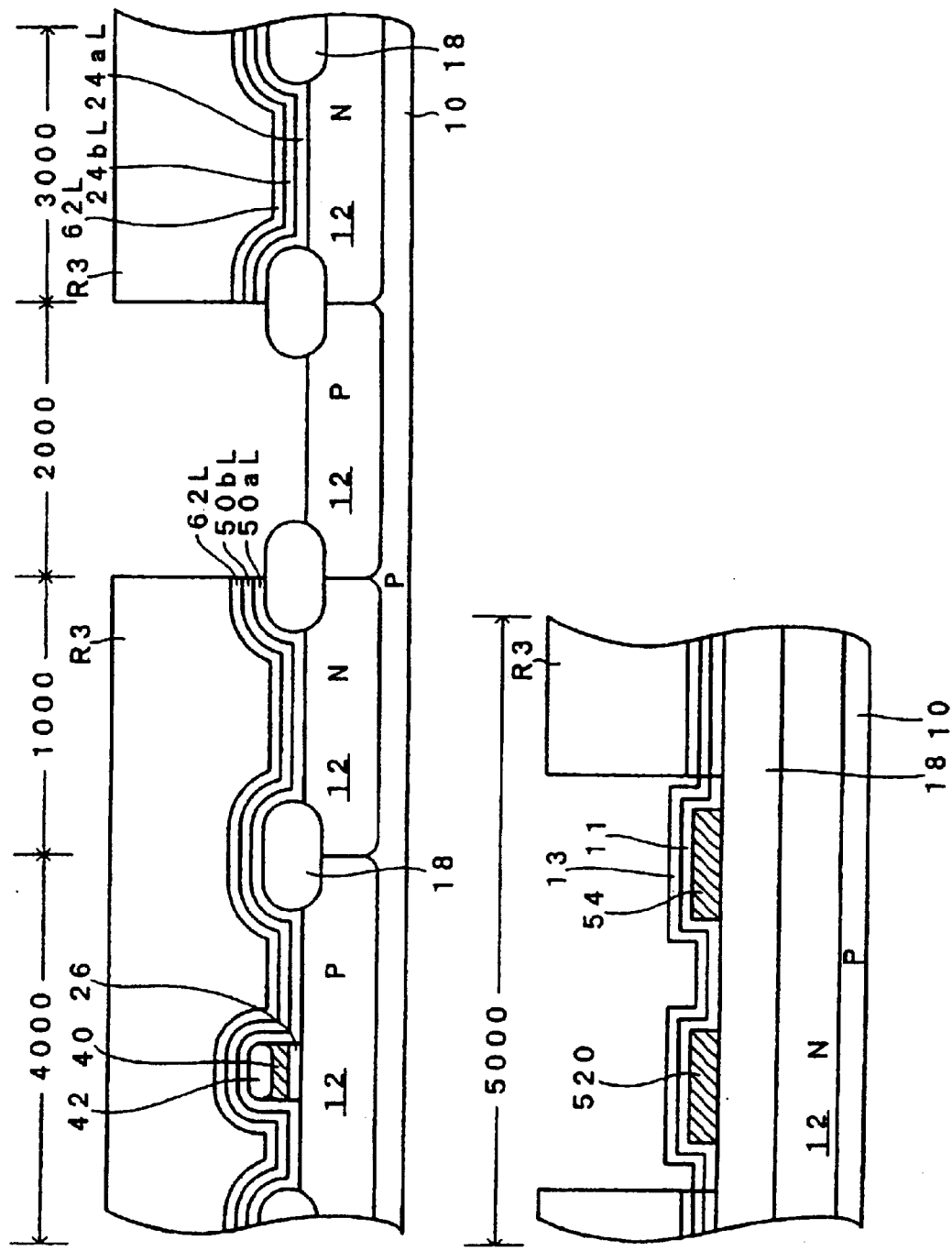
FIG. 14 is a cross-sectional view of the wafer in an thirteenth step of forming the semiconductor device shown in FIG. 1.

(M) Then, as shown in FIG. 14, a resist layer R3 defining opening sections in the second transistor region 2000 and the analog circuit region 5000 is formed. The second silicon nitride layer 62L, the upper silicon oxide layer 50bL (24bL) and the lower silicon oxide layer 50aL (24aL) in the second transistor region 2000 and the analog circuit region 5000 are removed by a dry-etching and a wet-etching, using the resist layer R3 as a mask. The silicon oxide layer 15 functions as an etching stopper during etching of the silicon nitride layer. Therefore, the silicon nitride layer 13 and the silicon oxide layer 11 located thereunder are not removed by the etching.

Then, the resist layer R3 is removed.

Figure 15:
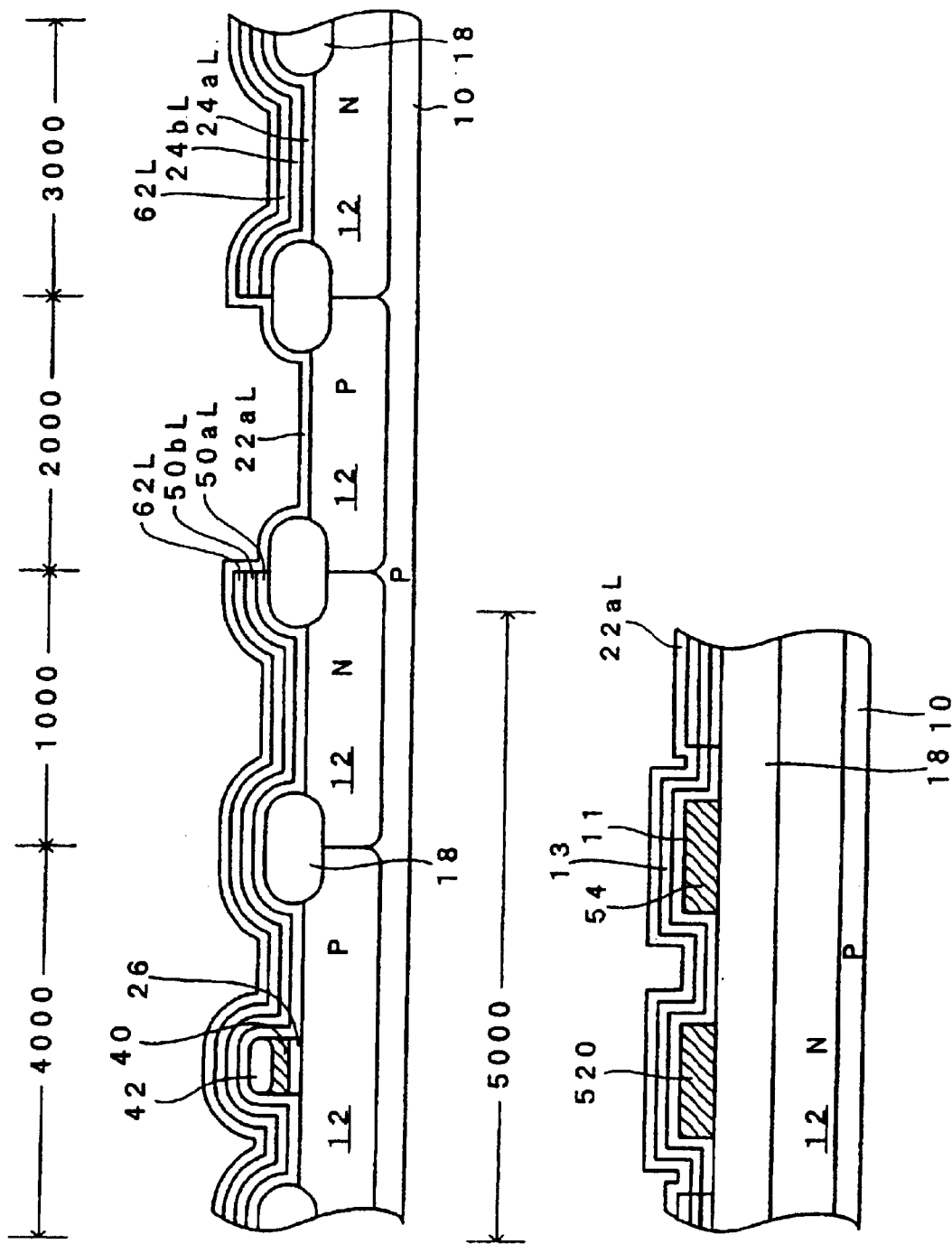
FIG. 15 is a cross-sectional view of the wafer in a fourteenth step of forming the semiconductor device shown in FIG. 1.

(N) Then, as shown in FIG. 15, the surface of the wafer is subject to a thermal oxidation, for example, a wet-oxidation at 700–1000° C., to thereby form a third silicon oxide layer 22aL over the surface of the wafer. The silicon oxide layer 22aL becomes a silicon oxide layer 22a that forms the gate insulation layer 22 of the second voltage-type transistor 200. The silicon oxide layer 22aL has a film thickness of 3–15 nm, for example.

Figure 16:
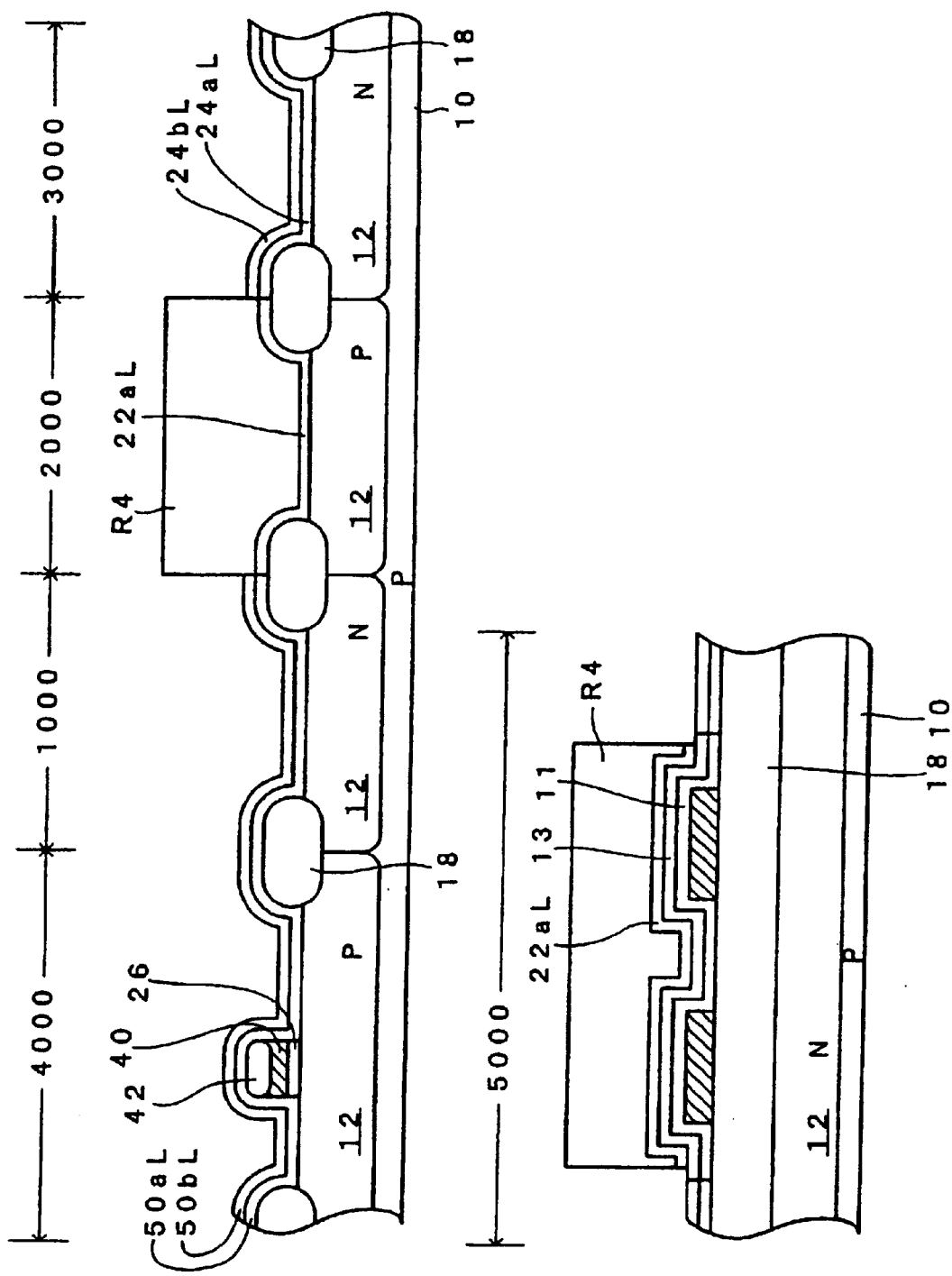
FIG. 16 is a cross-sectional view of the wafer in a fifteenth step of forming the semiconductor device shown in FIG. 1.

(O) Then, as shown in FIG. 16, resist layers R4 are formed over the surfaces of the silicon oxide layer 22aL in the second transistor region 2000 and the analog circuit region 5000. The silicon oxide layer 22aL and the second silicon nitride layer 62L are removed by a dry-etching method, using the resist layer R4 as a mask. Thereafter, the resist layer R4 is removed.

Figure 17:
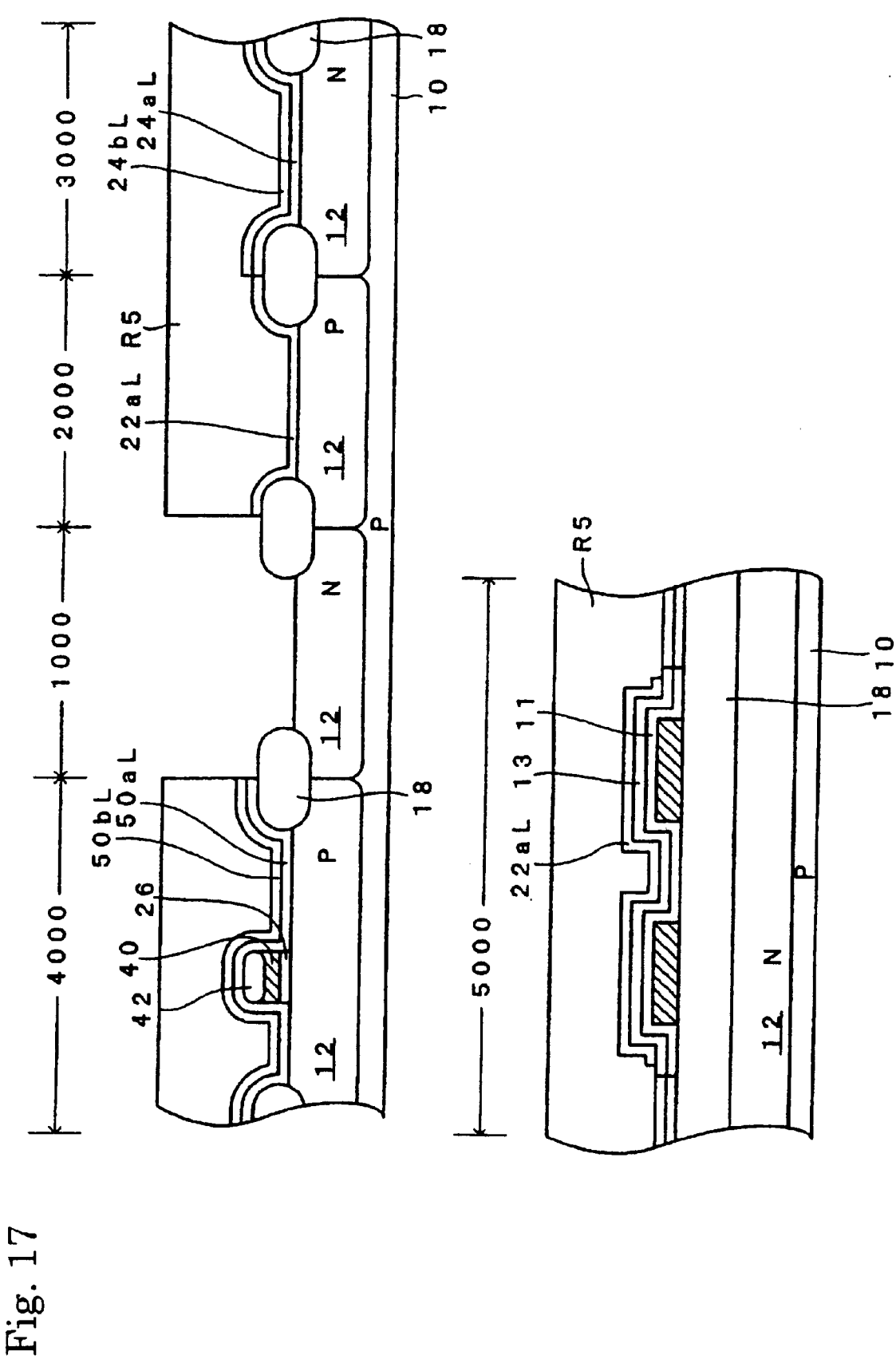
FIG. 17 is a cross-sectional view of the wafer in a sixteenth step of forming the semiconductor device shown in FIG. 1.

(P) Then, as shown in FIG. 17, a resist layer R5 defining an opening in the first transistor region 1000 is formed. The two silicon oxide layers 50bL and 50aL in the first transistor region 1000 are removed by a wet-etching method, using the resist layer R5 as a mask. Then, the resist layer R5 is removed.

Figure 18:
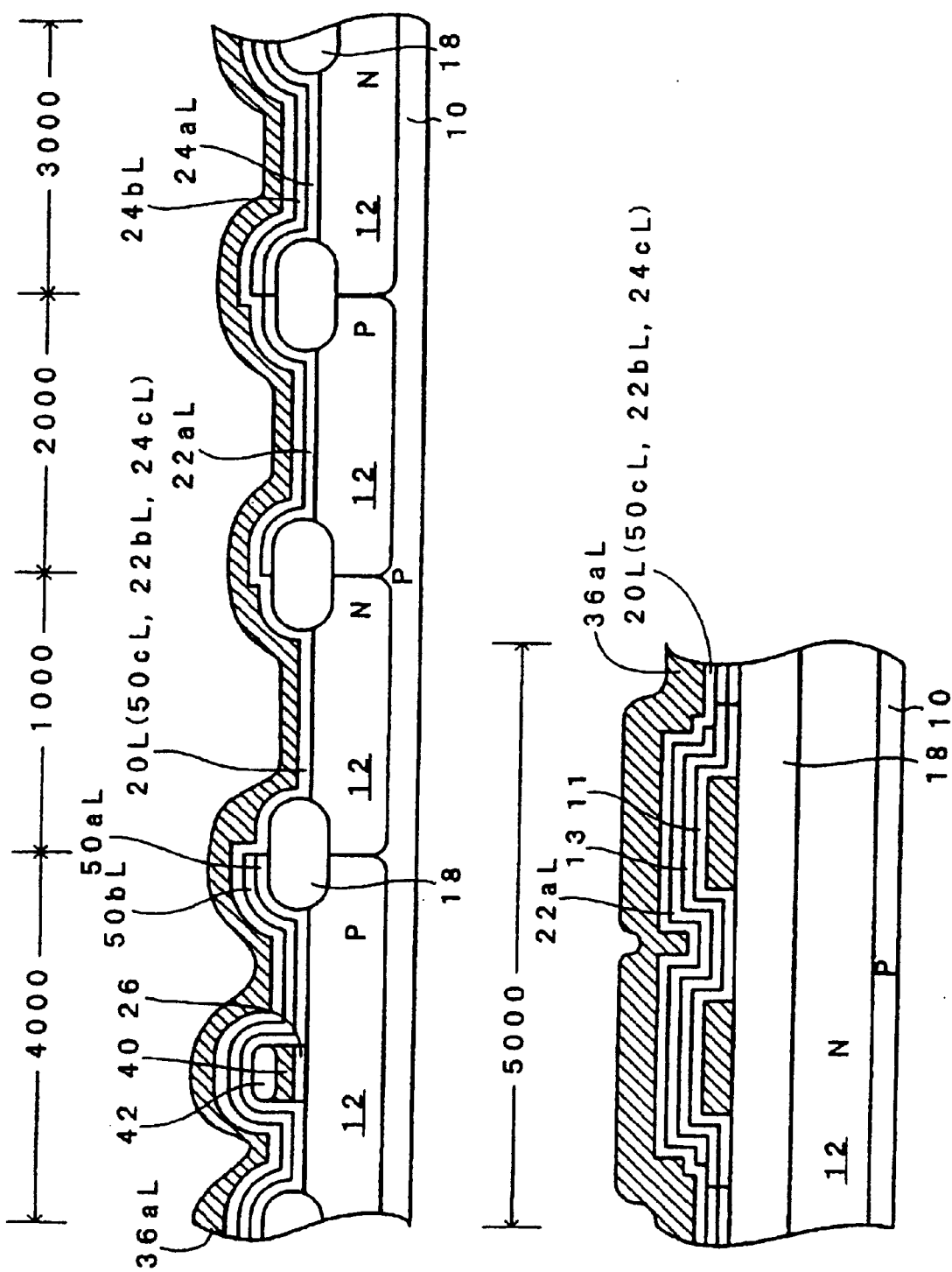
FIG. 18 is a cross-sectional view of the wafer in a seventeenth step of forming the semiconductor device shown in FIG. 1.
Figure 19:
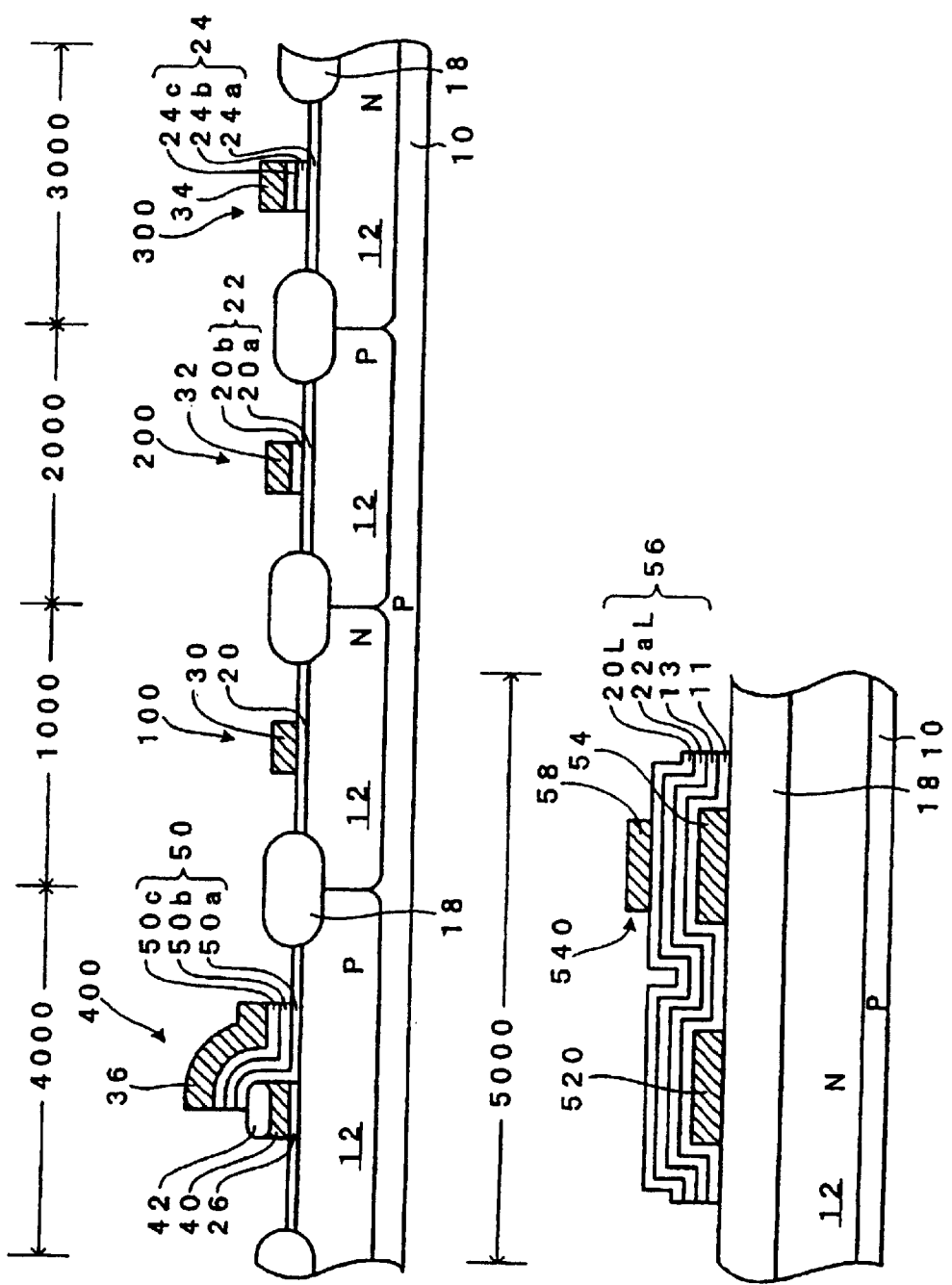
FIG. 19 is a cross-sectional view of the wafer in a eighteenth step of forming the semiconductor device shown in FIG. 1.

(Q) Then, as shown in FIG. 18, the surface of the wafer is subject to a thermal oxidation, for example, a wet-oxidation conducted at 700–1000° C., to form a fourth silicon oxide layer 20L (50cL, 22bL, 24cL) over the surface of the wafer. The silicon oxide layer 20L becomes the gate insulation layer 20 of the first voltage-type transistor 100, the silicon oxide layer 22b that forms the gate insulation layer 22 of the second voltage-type transistor 200, the silicon oxide layer 24c that forms the gate insulation layer 24 of the third voltage-type transistor 300, the silicon oxide layer 50c that forms the intermediate insulation layer 50 of the memory transistor 400, and the silicon oxide layer 20L that forms the capacitor insulation layer 56 of the capacitor 540. The silicon oxide layer 20L has a film thickness of 1–10nm, for example.

The steps described above form the insulation layers that compose the intermediate insulation layer 50 of the memory transistor 400, the gate insulation layer 20 of the first voltage-type transistor 100, the gate insulation layer 22 of the second voltage-type transistor 200 and the gate insulation layer 24 of the third voltage-type transistor 300. Also, the capacitor insulation layer 56 that forms the capacitor 540 is formed.

Then, a polysilicon layer 36aL is formed over the surface of the wafer in the same manner as conducted in step (B) described above. Alternatively, a polycide layer may be formed by a know method, instead of a polysilicon layer.

(R) Next, a resist layer having a predetermined pattern is formed over the polysilicon layer 36aL, and then a patterning is conducted by an etching to form a gate electrode of each of the memory transistor 400, the first voltage-type transistor 100, the second voltage-type transistor 200 and the third voltage-type transistor 300. Also, by this etching, an upper electrode 58 of the capacitor 540 is formed. In this instance, the etching is preferably conducted in a manner that the silicon oxide layer remains to a film thickness of 1–5 nm over exposed surfaces of the silicon substrate 10.

(S) Then, as shown in FIG. 1, an N-type impurity for an N-channel type transistor and a P-type impurity for a P-channel type transistor are doped in predetermined ones of the wells 12 by a know method. As a result, impurity diffusion regions that compose the sources 16 and the drains 14 are formed.

Then, an interlayer dielectric layer 800 that is composed of a silicon oxide layer is formed by, for example, a CVD method over the surface of the wafer on which the transistors 100, 200 and 300, the memory transistor 400, the resistor 520 and the capacitor 540 are formed. Then, the interlayer dielectric layer 800 is selectively etched to remove predetermined regions thereof to define contact holes that reach the sources 16, the drains 14, one end of the resistor 520, the other end of the resistor 520 and the upper electrode 58. Then, a conductive layer composed of, for example, an aluminum layer or the like is deposited on the interlayer dielectric layer 800 and in the contact holes by, for example, a sputtering method. The conductive layer is patterned to form metal wiring layers (for example, bit lines and source lines) 80 that electrically connect to the impurity diffluusion layers, the resistor 520 and the upper electrode 58.

In the manufacturing method described above, the memory transistor 400, the first voltage-type transistor 100, the second voltage-type transistor 200, the third voltage-type transistor 300, the resistor 520 and the capacitor 540 are formed in the memory region 4000, the first transistor region 1000, the second transistor region 2000, the third transistor region 3000 and the analog circuit region 5000. According to this manufacturing method, a semiconductor device having memory transistors with a split-gate structure, transistors that operate at at least three different voltage levels, resistors and capacitors mixed and mounted thereon can be manufactured with fewer manufacturing steps.

More particularly, in certain embodiments, the manufacturing steps are simplified by the following methods (1) through (5).

(1) The silicon oxide layer 50aL (24aL) is composed of the silicon oxide layer 24a that forms the gate insulation layer 24 of the third voltage-type transistor 300 and the silicon oxide layer 50a that forms the intermediate insulation layer 50 of the memory transistor 400, such that the steps for forming these layers are commonly conducted.

(2) The silicon oxide layer 50bL (24bL) is composed of the silicon oxide layer 24a that forms the gate insulation layer 24 of the third voltage-type transistor 300 and the silicon oxide layer 50b that forms the intermediate insulation layer 50 of the memory transistor 400, such that the steps for forming these layers are commonly conducted.

(3) The silicon oxide layer 22aL is composed of the silicon oxide layer 22a that forms the gate insulation layer 22 of the second voltage-type transistor 200 and the silicon oxide layer 22aL that forms the capacitor insulation layer 56 of the capacitor 540, such that the steps for forming these layers are commonly conducted.

(4) The silicon oxide layer 20L (50cL, 22bL, 24cL) is composed of the gate insulation layer 20 of the first voltage-type transistor 100, the silicon oxide layer 22b that forms the gate insulation layer 22 of the second voltage-type transistor 200, the silicon oxide layer 24c that forms the gate insulation layer 24 of the third voltage-type transistor 300, the silicon oxide layer 50c that forms the intermediate insulation layer 50 of the memory transistor 400, and the silicon oxide layer 20L that forms the capacitor insulation layer 56 of the capacitor 540. As a result, the steps for forming these layers are commonly conducted.

(5) The polysilicon layer 36aL is composed of the control gate 36 of the memory transistor 400, the gate electrode 30 of the first voltage-type transistor 100, the gate electrode 32 of the second voltage-type transistor 200, the gate electrode 34 of the third voltage-type transistor 300 and the upper electrode 58 of the capacitor 540, such that the steps of forming these layers are commonly conducted.

Also, the manufacturing methods preferably provide a semiconductor device having a non-volatile memory transistor with a split gate structure, transistors that operate at least at three different voltage levels, a resistor and a capacitor that are mixed and mounted thereon, in which each of the device elements attains its designed performance.

In particular, the following methods (1) through (3) are preferably implemented to achieve the designed performances of the respective device elements.

(1) The step of forming the lower electrode 54 of the capacitor 540, and the step of forming the electrode layers (the control gate 36, the gate electrode 30, the gate electrode 32, the gate electrode 34, and the upper electrode 58) are conducted in different steps. As a result, the characteristics required for the lower electrode 54, the characteristics required for the floating gate 40, and the characteristics required for the electrode layers can be independently optimized.

(2) The step of forming the gate insulation layer 26 of the memory transistor 400, and the step of forming the other insulation layers (the capacitor insulation layer 56, the gate insulation layers 20, 22 and 24, and the intermediate insulation layer 50) are conducted in different steps. As a result, the characteristics of the gate insulation layer 26 of the memory transistor 400 can be optimized.

(3) In steps (K) and (L) in the manufacturing method described above, the silicon oxide layers 50aL and 50bL that form the intermediate insulation layer (tunnel insulation layer) 50 are formed, and then the silicon nitride layer 62L is formed. As a result, the silicon oxide layers 50aL and 50bL are covered and protected by the silicon nitride layer 62L in a thermal oxidation that is later conducted or in cleaning steps before or after the thermal oxidation. Adverse effects of the thermal oxidation step and the cleaning steps on the layers can be suppressed. As a result, a tunnel insulation layer having excellent characteristics can be obtained, and highly reliable memory characteristics can be realized.

Further, while the silicon nitride layer 62L is formed over the silicon oxide layers 50*a*L and 50*b*L, a thermal treatment (including a thermal treatment in an oxidation process) is preferably conducted. As a result, the silicon oxide layers are densified and the film quality of the silicon oxide layers is improved. Thus, the memory characteristics can be improved. In particular, the number of data wiring/erasing operations (cycle life) can be extended.

Figure 20:
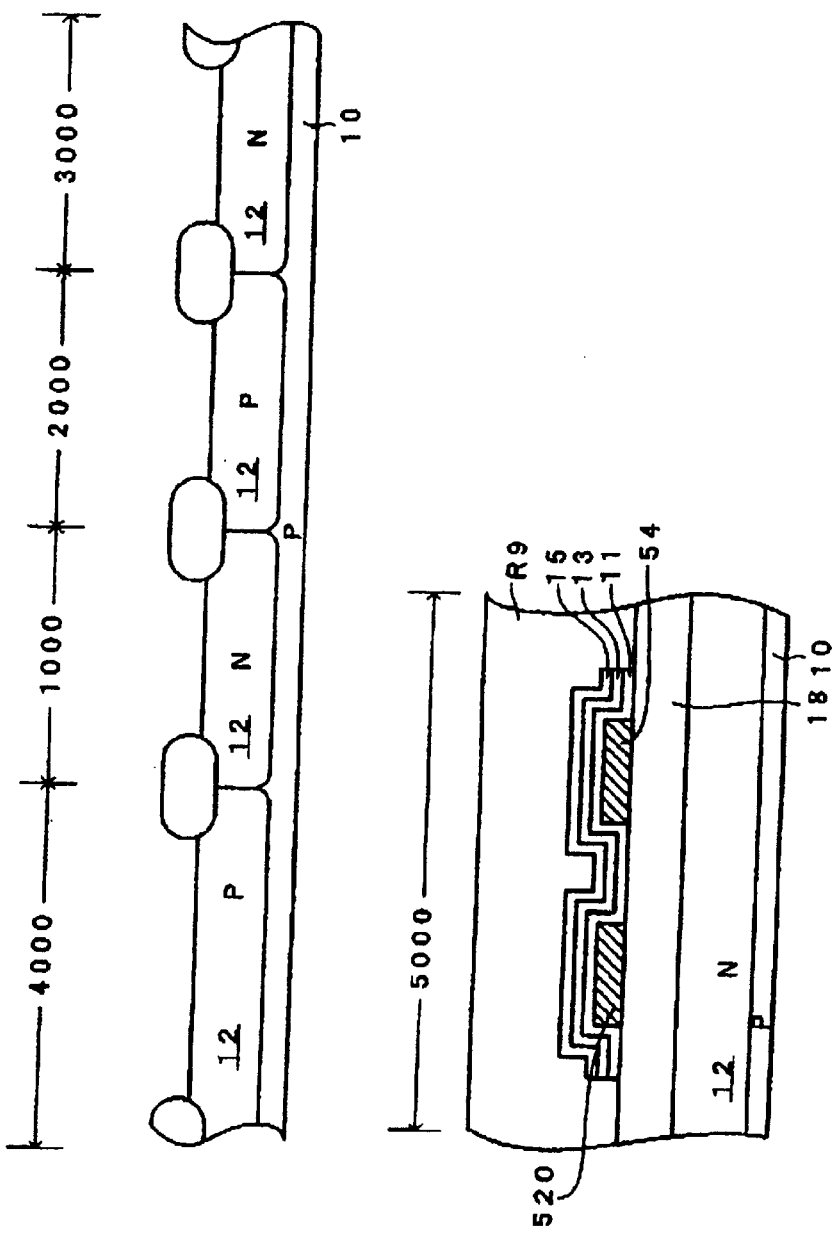
FIG. 20 is a cross-sectional view of a wafer in another embodiment of a manufacturing method for forming the semiconductor device shown in FIG. 1.

Moreover, as described in the section (F) above, the oxide film 19 is removed while the analog circuit region 5000 is exposed. However, as shown in FIG. 20, the oxide film 19 may be removed while the analog circuit region 5000 is covered by the resist R9. In this case, since the silicon oxide layer 15 is not exposed, the silicon oxide layer 15 is not etched. Since the silicon oxide layer 15 is not affected by the etching, the thickness of the silicon oxide layer 15 can be 10–40 nm.

What is claimed:

1. A method for manufacturing a semiconductor device comprising a non-volatile memory transistor having a split gate structure formed in a memory region and a capacitor formed in a capacitor region, the capacitor having a structure in which a capacitor insulation layer is interposed between a first capacitor electrode and a second capacitor electrode, the method comprising the steps of:

(a) forming the first capacitor electrode in the capacitor region;

(b) forming the capacitor insulation layer in the capacitor region;

(c) forming a gate insulation layer that becomes a component of the non-volatile memory transistor in the memory region;

(d) forming a floating gate that becomes a component of the non-volatile memory transistor in the memory region;

(e) forming an intermediate insulation layer that becomes a component of the non-volatile memory transistor in the memory region;

(f) forming a control gate that becomes a component of the non-volatile memory transistor in the memory region; and (g) forming the second capacitor electrode in the capacitor region; wherein said forming the control gate and said forming the second capacitor electrode are carried out during the same processing step; and
   wherein said forming the first capacitor electrode and said forming the floating gate are carried out during different processing steps.

2. A method for manufacturing a semiconductor device comprising a non-volatile memory transistor according to claim 1, wherein the step (b) and the step (c) are different steps.

3. A method for manufacturing a semiconductor device comprising a non-volatile memory transistor according to claim 2, wherein the step (b) comprises the steps of:

(b1) forming a first silicon oxide layer that becomes a component of the capacitor insulation layer in the capacitor region;

(b2) forming a silicon nitride layer that becomes a component of the capacitor insulation layer in the capacitor region; and (b3) forming a second silicon oxide layer that becomes a component of the capacitor insulation layer in the capacitor region,
   wherein the step (b1) and the step (c) are different steps.

4. A method for manufacturing a semiconductor device comprising a non-volatile memory transistor according to claim 3, further comprising, after the step (b2), the step of:

(h) forming a third silicon oxide layer in the capacitor region to cover the silicon nitride layer that becomes a component of the capacitor insulation layer.

5. A method for manufacturing a semiconductor device comprising a non-volatile memory transistor according to claim 4, further comprising, between the step (h) and the step (c), the step of:

(i) etching the memory region in a state in which the third silicon oxide layer is exposed to thereby expose a semiconductor layer in the memory region, wherein the third silicon oxide layer has a sufficient thickness that is not to be removed by the etching step.

6. A method for manufacturing a semiconductor device comprising a non-volatile memory transistor according to claim 4, further comprising, between the step (h) and the step (c), the step of:

(i) etching the memory region in a state in which the third silicon oxide layer is covered by a resist layer to thereby expose a semiconductor layer in the memory region.

7. A method for manufacturing a semiconductor device comprising a non-volatile memory transistor according to claim 1, further comprising the step (k) of forming a resistor in a resistor region, wherein the step (a), the step (d) and the step (k) are carried out during the same processing step.

8. A method for manufacturing a semiconductor device comprising a non-volatile memory transistor according to claim 3, further comprising the step (1) of forming a resistor in a resistor region, wherein the step (b2) includes the step of forming a silicon nitride layer that becomes a component of the capacitor insulation layer in the register region to cover the resistor,
   wherein the steps to be conducted thereafter are conducted in a state in which the resistor is covered by the silicon nitride layer.

9. A method for manufacturing a semiconductor device comprising a non-volatile memory transistor according to claim 3, wherein the step (b3) comprises the steps of:

forming a lower silicon oxide layer; and forming an upper silicon oxide layer.

10. A method for manufacturing a semiconductor device comprising a non-volatile memory transistor according to claim 9, wherein the semiconductor device comprises:

a first voltage-type transistor that is formed in a first transistor region and operated at a first voltage level;

a second voltage-type transistor that is formed in a second transistor region and operated at a second voltage level; and a third voltage-type transistor that is formed in a third transistor region and operated at a third voltage level,
   wherein the first voltage-type transistor has a gate insulation layer of a one-layer structure,
   the second voltage-type transistor has a gate insulation layer of a two-layer structure, and
   the third voltage-type transistor has a gate insulation layer of a three-layer structure,
   wherein the step of forming the gate insulation layer of the first voltage-type transistor, the step of forming an upper layer of the gate insulation layer of the second voltage-type transistor, the step of forming an upper layer of the gate insulation layer of the third voltage-type transistor, the step of forming an upper layer of the intermediate insulation layer that forms the non-volatile memory transistor, and the step (b3) of forming the upper silicon oxide layer are carried out during the same processing step.

11. A method for manufacturing a semiconductor device comprising a non-volatile memory transistor according to claim 9, wherein the step of forming a lower layer of the gate insulation layer of the second voltage-type transistor and the step (b3) of forming the upper silicon oxide layer are carried out during the same processing step.

12. A method for manufacturing a semiconductor device comprising a non-volatile memory transistor according to claim 1, wherein the capacitor forms an analog circuit.

13. A method for manufacturing a semiconductor device comprising a non-volatile memory transistor having a split gate structure formed in a memory region and a capacitor formed in a capacitor region, the capacitor including a capacitor insulation layer positioned between a first capacitor electrode and a second capacitor electrode, the method comprising:
    forming the first capacitor electrode in the capacitor region;
    forming the capacitor insulation layer in the capacitor region;
    forming a gate insulation layer that becomes a component of the non-volatile memory transistor in the memory region;
    forming a floating gate that becomes a component of the non-volatile memory transistor in the memory region;
    forming an intermediate insulation layer that becomes a component of the non-volatile memory transistor in the memory region;
    forming a control gate that becomes a component of the non-volatile memory transistor in the memory region; and
    forming the second capacitor electrode in the capacitor region;
    wherein the control gate and the second capacitor electrode are formed from the same material during the same processing step.

14. A method for manufacturing a semiconductor device as in claim 13, further comprising forming a resistor in a resistor region, wherein first capacitor electrode, the floating gate, and the resistor are formed from the same material during the same processing step.

15. A method for manufacturing a semiconductor device as in claim 8, wherein the step (b3) comprises forming a lower silicon oxide layer and forming an upper silicon oxide layer.

16. A method for forming a semiconductor device, comprising:
    forming a non-volatile memory transistor on a substrate, the non-volatile memory transistor including a split gate structure and a floating gate;
    forming a capacitor on the substrate, the capacitor including a capacitor insulation layer positioned between a first capacitor electrode and a second capacitor electrode; and
    forming the floating gate of the non-volatile memory transistor to have a film thickness that is different from that of the first capacitor electrode.

17. A method as in claim 16, wherein the non-volatile memory transistor includes a control gate, and wherein the method further comprises forming the control gate and the second capacitor electrode to have an equal film thickness.

18. A method as in claim 16, further comprising forming a resistor on the substrate, wherein the resistor and the first capacitor electrode are formed during the same processing step.

19. A method for forming a semiconductor device, comprising:
    forming a non-volatile memory transistor on a substrate, the non-volatile memory transistor formed to including a split gate structure and a floating gate;
    forming a capacitor on the substrate, the capacitor formed to include a capacitor insulation layer between a first capacitor electrode and a second capacitor electrode; and
    forming the floating gate of the non-volatile memory transistor to have an impurity concentration that is different from that of the first capacitor electrode.

20. A method as in claim 19, wherein the non-volatile memory transistor includes a control gate, and wherein the method further comprises forming the control gate and the second capacitor electrode during a common processing step.

21. A method for forming a semiconductor device comprising a capacitor and a non-volatile memory transistor having a split gate structure, comprising:
    forming a non-volatile memory transistor having a floating gate therein, wherein the floating gate is formed from a first material;
    forming a capacitor by a method including forming a first capacitor electrode, forming a capacitor insulation layer, and forming a second capacitor electrode, wherein the capacitor insulation layer is disposed between the first capacitor electrode and the second capacitor electrode, and
    forming the first capacitor electrode from a second material that is different than the first material.

22. A method as in claim 21, wherein the first material consists essentially of polycrystalline silicon having a first grain size and the second material consists essentially of polycrystalline silicon having a second grain size that is different than the first grain size.

23. A method as in claim 21, wherein the first material consists essentially of amorphous silicon and the second material consists essentially of polycrystalline silicon.

24. A method as in claim 21, wherein the non-volatile memory transistor includes a control gate, and wherein the method further comprises forming the control gate and the second capacitor electrode from the same material and during the same processing step.

25. A method as in claim 21, further comprising forming the capacitor insulation layer to include a first silicon oxide layer, a silicon nitride layer, and a second silicon oxide layer.

26. A method as in claim 13, further comprising forming the capacitor insulation layer to include a first silicon oxide layer, a silicon nitride layer and a second silicon oxide layer.

27. A method as in claim 1, further comprising:
    forming a first voltage type transistor in a first transistor region, the first voltage type transistor formed to have a first range of operating voltages;
    forming a second voltage type transistor in a second transistor region, the second voltage type transistor formed to have a second range of operating voltages; and
    forming a third voltage type transistor in a third region, wherein the third voltage type transistor has a third range of operating voltages.

28. A method as in claim 27, wherein the first range is from 1.8 volts to 3.3 volts in an absolute value, the second range is from 2.5 volts to 5 volts in an absolute value, and the third range is from 10 volts to 15 volts in an absolute value.

29. A method as in claim 27, wherein the first voltage type transistor includes a gate insulation layer formed from a single layer, the second voltage type transistor includes a gate insulation layer formed from two layers, and the third voltage type transistor includes a gate insulation layer formed from three layers.

30. A method as in claim 21, further comprising forming the capacitor insulation layer by forming a first silicon oxide layer, forming a silicon nitride layer on the first silicon oxide layer, forming a second silicon oxide layer on the silicon nitride layer, and forming a third silicon oxide layer on the second silicon oxide layer.

31. A method as in claim 25, further comprising forming the capacitor insulation layer to include a third silicon oxide layer on the second silicon oxide layer, and wherein the capacitor insulation layer is formed to have a thickness of from 21 nm to 55 nm.

* * * * *